US012772878B2

(12) United States Patent
Elsherbini et al.

(10) Patent No.: US 12,772,878 B2
(45) Date of Patent: Oct. 20, 2026

(54) SPLIT METALLIZATION LAYERS IN MULTICHIP DEVICES

(71) Applicant: Intel Corporation, Santa Clara, CA (US)

(72) Inventors: Adel Elsherbini, Chandler, AZ (US); Beomseok Choi, Chandler, AZ (US); Feras Eid, Chandler, AZ (US); Omkar Karhade, Chandler, AZ (US); Shawna Liff, Scottsdale, AZ (US)

(73) Assignee: Intel Corporation, Santa Clara, CA (US)

(*) Notice: Subject to any disclaimer, the term of this patent is extended or adjusted under 35 U.S.C. 154(b) by 194 days.

(21) Appl. No.: 17/891,536

(22) Filed: Aug. 19, 2022

(65) Prior Publication Data

US 2024/0063133 A1 Feb. 22, 2024

(51) Int. Cl.
*H10W 70/65* (2026.01)
*H10W 20/20* (2026.01)
(Continued)

(52) U.S. Cl.
CPC .......... *H10W 70/65* (2026.01); *H10W 20/20* (2026.01); *H10W 70/093* (2026.01);
(Continued)

(58) Field of Classification Search
CPC . H10W 70/65; H10W 70/093; H10W 70/611; H10W 70/614; H10W 20/20; H10W 74/01; H10W 74/117; H10W 74/012; H10W 74/019; H10W 74/15; H10W 90/00; H10W 90/701; H10W 90/20; H10W 90/24; H10W 90/288;
(Continued)

(56) References Cited

U.S. PATENT DOCUMENTS

| | | | |
|---|---|---|---|
| 5,272,104 | A | 12/1993 | Schrantz et al. |
| 6,211,463 | B1 | 4/2001 | Fabis |

(Continued)

FOREIGN PATENT DOCUMENTS

| | | |
|---|---|---|
| CN | 205039151 | 2/2016 |
| CN | 111627887 | 9/2020 |

OTHER PUBLICATIONS

Jani, I., et al., "Innovative structures to test bonding alignment and characterize high density interconnects in 3D-IC", 15th IEEE International New Circuits and Systems Conference (NEWCAS), 2017, pp. 153-156.

(Continued)

*Primary Examiner* — Dao H Nguyen

(74) *Attorney, Agent, or Firm* — Essential Patents Group, LLP

(57) ABSTRACT

A multichip composite device includes on- and off-die metallization layers, inorganic dielectric material, and stacked hybrid-bonded dies. On-die metallization layers may be thinner than off-die metallization layers. The multichip composite device may include a structural substrate. Off-die metallization layers may be above and below the stacked hybrid-bonded dies. A substrate may couple the multichip composite device to a power supply in a multichip system. Forming a multichip composite device includes hybrid bonding dies and forming inorganic dielectric material.

14 Claims, 20 Drawing Sheets

(51) Int. Cl.
*H10W 70/05* (2026.01)
*H10W 70/60* (2026.01)
*H10W 74/01* (2026.01)
*H10W 74/10* (2026.01)
*H10W 80/00* (2026.01)
*H10W 90/00* (2026.01)
*H10W 90/20* (2026.01)
*H10W 90/24* (2026.01)

(52) U.S. Cl.
CPC ........ *H10W 70/611* (2026.01); *H10W 70/614* (2026.01); *H10W 74/01* (2026.01); *H10W 74/117* (2026.01); *H10W 90/00* (2026.01); *H10W 90/701* (2026.01); *H10W 80/312* (2026.01); *H10W 80/327* (2026.01); *H10W 90/20* (2026.01); *H10W 90/24* (2026.01); *H10W 90/288* (2026.01); *H10W 90/297* (2026.01); *H10W 90/792* (2026.01); *H10W 90/794* (2026.01)

(58) Field of Classification Search
CPC ............. H10W 90/297; H10W 90/792; H10W 90/794; H10W 80/327; H10W 80/00; H10W 72/823; H10W 72/90
See application file for complete search history.

(56) References Cited

U.S. PATENT DOCUMENTS 6,486,954 B1 11/2002 Mieher et al.
6,570,362 B1 5/2003 Estes et al.
7,030,772 B1 4/2006 Lee et al.
8,584,061 B2 11/2013 Shibata et al.
9,219,042 B2 12/2015 Paek et al.
9,275,929 B2 3/2016 Liou et al.
9,324,698 B2 4/2016 Yu et al.
9,368,479 B2 6/2016 Katkar et al.
9,396,997 B2 7/2016 Hirler et al.
9,418,967 B2 8/2016 Koshiishi et al.
9,570,399 B2 2/2017 Yang et al.
9,589,945 B2 3/2017 Jo et al.
9,978,694 B2 5/2018 Cho et al.
10,026,715 B2 7/2018 Kume et al.
10,157,892 B1 12/2018 Chen et al.
10,276,544 B2 4/2019 Matsumoto et al.
10,290,571 B2 * 5/2019 Yu ...................... H01L 21/4857
10,312,201 B1 6/2019 Hu et al.
10,347,598 B2 7/2019 Baek et al.
10,381,298 B2 * 8/2019 Yu ...................... H01L 21/4857
10,381,326 B2 8/2019 Woychik et al.
10,510,650 B2 12/2019 Yu et al.
11,094,672 B2 8/2021 Elsherbini et al.
11,195,817 B2 12/2021 Huang et al.
11,387,222 B2 * 7/2022 Yu .......................... H01L 24/19
12,068,234 B2 8/2024 Chen et al.
12,272,568 B2 4/2025 Chen et al.
2002/0074649 A1 6/2002 Chrysler et al.
2002/0141155 A1 10/2002 Pinneo
2006/0043367 A1 3/2006 Chang et al.
2006/0113546 A1 6/2006 Sung
2008/0246126 A1 10/2008 Bowles et al.
2009/0134500 A1 5/2009 Kuo
2009/0174050 A1 7/2009 Bernstein et al.
2012/0061827 A1 3/2012 Fujita
2013/0134548 A1 5/2013 Torii
2013/0139524 A1 6/2013 Kim et al.
2013/0221493 A1 8/2013 Kim et al.
2013/0250527 A1 9/2013 Hatanaka et al.
2014/0070407 A1 3/2014 Lee et al.
2014/0231815 A1 8/2014 Railkar et al.
2014/0264772 A1 9/2014 Horng et al.
2014/0293543 A1 10/2014 Kim et al.
2015/0200153 A1 7/2015 Wang et al.
2016/0093533 A1 3/2016 Yow et al.
2017/0084544 A1 3/2017 Chen
2017/0092561 A1 3/2017 Eid et al.
2017/0207197 A1 7/2017 Yu et al.
2017/0213766 A1 7/2017 Kitayama
2018/0158744 A1 6/2018 Song et al.
2018/0158749 A1 6/2018 Yu et al.
2018/0240756 A1 8/2018 Foo et al.
2019/0051612 A1 2/2019 Kim et al.
2019/0096868 A1 3/2019 Tsou et al.
2019/0103390 A1 4/2019 Chen et al.
2019/0139896 A1 5/2019 Hsu et al.
2019/0244947 A1 8/2019 Yu et al.
2019/0393190 A1 12/2019 Delacruz et al.
2019/0393192 A1 12/2019 Eid et al.
2019/0393193 A1 12/2019 Eid et al.
2020/0091029 A1 3/2020 Jeng et al.
2020/0105639 A1 4/2020 Valavala et al.
2020/0185330 A1 6/2020 Yu et al.
2020/0211920 A1 7/2020 Lee et al.
2020/0312741 A1 10/2020 Wan et al.
2020/0312774 A1 10/2020 Yu et al.
2020/0335480 A1 10/2020 Hwang et al.
2021/0020601 A1 1/2021 Chen et al.
2021/0066279 A1 * 3/2021 Yu ......................... H01L 23/367
2021/0096311 A1 4/2021 Yu et al.
2021/0098422 A1 4/2021 Elsherbini et al.
2021/0118756 A1 4/2021 Wan et al.
2021/0118770 A1 4/2021 Kuo et al.
2021/0159179 A1 5/2021 Elsherbini et al.
2021/0193567 A1 * 6/2021 Cheah ................. H01L 23/5381
2021/0375830 A1 12/2021 Elsherbini
2021/0407932 A1 12/2021 Kabir et al.
2022/0037281 A1 2/2022 Elsherbini et al.
2022/0157691 A1 5/2022 Sharfi et al.
2022/0310411 A1 9/2022 Chen et al.
2022/0310501 A1 9/2022 Wang et al.
2022/0344233 A1 10/2022 Chang
2022/0406751 A1 12/2022 Elsherbini et al.
2023/0067349 A1 * 3/2023 Lin ......................... H01L 25/50
2023/0115745 A1 4/2023 Wang et al.
2023/0154825 A1 5/2023 Tong
2023/0369070 A1 11/2023 Ho et al.
2024/0008184 A1 * 1/2024 Kuo ..................... H05K 1/0216
2024/0063142 A1 2/2024 Elsherbini et al.
2024/0153840 A1 5/2024 Jeng et al.
2024/0222215 A1 7/2024 Chen et al.
2025/0349642 A1 11/2025 Wang et al.

OTHER PUBLICATIONS

Bischof, David et al., “Laser-assisted etching of borosilicate glass in potassium hydroxide,” Optical Materials Express, vol. 11, No. 4, Apr. 1, 2021, 11 pgs.

Liu, Xue-Qing et al., “Etching-assisted femtosecond laser modification of hard materials,” 2019 Institute of Optics and Electronics, Chinese Academy of Sciences, vol. 2, No. 9, pp. 190021-1-190021-14.

* cited by examiner

SPLIT METALLIZATION LAYERS IN MULTICHIP DEVICES

BACKGROUND

Device performance and cost pressures drive a continuous and increasing demand for denser and cheaper multichip devices. Such density improvements could readily impact larger and more complex devices but require correspondingly dense interconnections between tightly packed chips. For example, processor performance can be improved by interconnecting processor and memory chips in smaller spaces or by packing more processor and memory chips into the same space. More complex systems can be made better or less expensive with denser and cheaper multichip devices.

Structures and methods are needed to improve multichip devices and the larger systems they make up. It is with respect to these and other considerations that the present improvements have been needed. Such improvements may become critical as the desire to improve multichip devices becomes even more widespread.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements, e.g., with the same or similar functionality. The disclosure will be described with additional specificity and detail through use of the accompanying drawings.

DETAILED DESCRIPTION

Figure 1A:
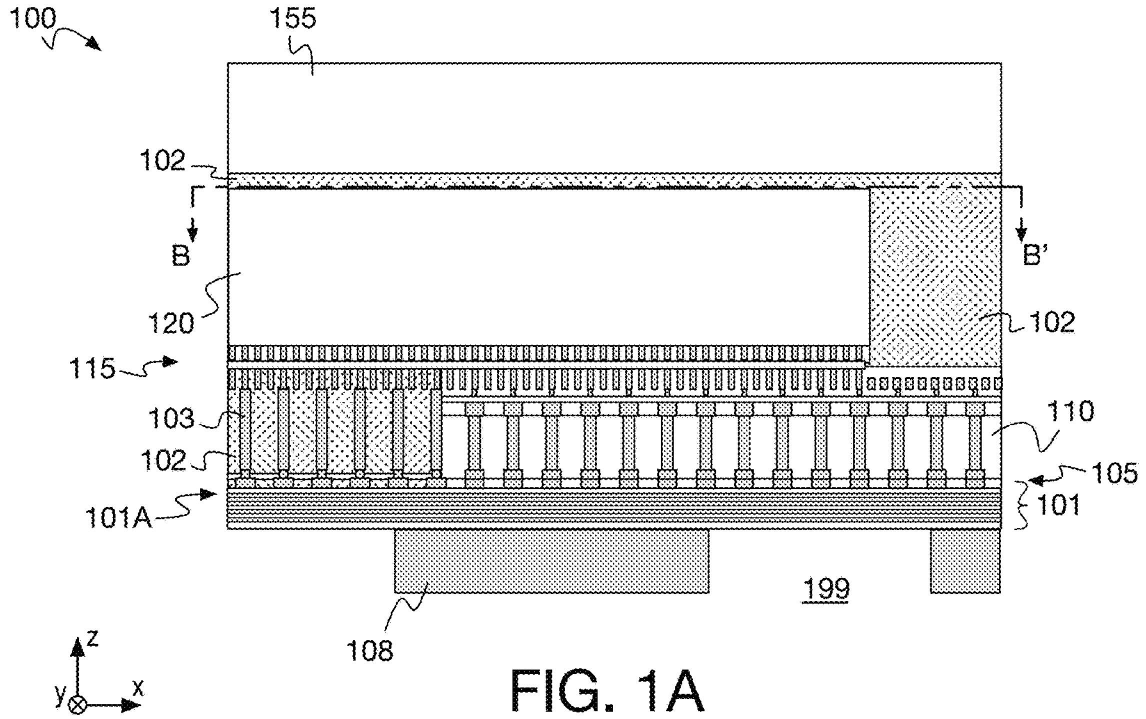
FIGS. 1A, 1B, and 1C illustrate cross-sectional profile and plan views of a multichip composite device, including metallization layers coupled to a first die and a second die.

In the following detailed description, reference is made to the accompanying drawings that show, by way of illustration, specific embodiments in which the claimed subject matter may be practiced. These embodiments are described in sufficient detail to enable those skilled in the art to practice the subject matter. The various embodiments, although different, are not necessarily mutually exclusive. For example, a particular feature, structure, or characteristic described herein, in connection with one embodiment, may be implemented within other embodiments without departing from the spirit and scope of the claimed subject matter.

References within this specification to “one embodiment” or “an embodiment” mean that a particular feature, structure, or characteristic described in connection with the embodiment is included in at least one implementation encompassed within the present description. Therefore, the use of the phrase “one embodiment” or “in an embodiment” does not necessarily refer to the same embodiment. In addition, the location or arrangement of individual elements within each disclosed embodiment may be modified without departing from the spirit and scope of the claimed subject matter. The following detailed description is, therefore, not to be taken in a limiting sense, and the scope of the subject matter is defined only by the appended claims, appropriately interpreted, along with the full range of equivalents to which the appended claims are entitled.

The terms “over,” “to,” “between,” and “on” as used herein may refer to a relative position of one layer with respect to other layers. One layer “over” or “on” another layer or bonded “to” another layer may be directly in contact with the other layer or may have one or more intervening layers. One layer “between” layers may be directly in contact with the layers or may have one or more intervening layers.

The terms “coupled” and “connected,” along with their derivatives, may be used herein to describe structural relationships between components. These terms are not intended as synonyms for each other. Rather, in particular embodiments, “connected” may be used to indicate that two or more elements are in direct physical or electrical contact with each other. “Coupled” may be used to indicated that two or more elements are in either direct or indirect (with other intervening elements between them) physical or electrical contact with each other, and/or that the two or more elements co-operate or interact with each other (e.g., as in a cause an effect relationship, an electrical relationship, a functional relationship, etc.).

The term “circuit” or “module” may refer to one or more passive and/or active components that are arranged to cooperate with one another to provide a desired function. The term “signal” may refer to at least one current signal, voltage signal, magnetic signal, or data/clock signal. The meaning of “a,” “an,” and “the” include plural references. The meaning of “in” includes “in” and “on.”

The vertical orientation is in the z-direction and recitations of “top,” “bottom,” “above,” and “below” refer to relative positions in the z-dimension with the usual meaning. However, embodiments are not necessarily limited to the orientations or configurations illustrated in the figure. The term “aligned” (i.e., vertically or laterally) indicates at least a portion of the components are aligned in the pertinent direction while "fully aligned" indicates an entirety of the components are aligned in the pertinent direction.

The terms "substantially," "close," "approximately," "near," and "about," generally refer to being within +/−10% of a target value (unless specifically specified). Unless otherwise specified in the specific context of use, the term "predominantly" means more than 50%, or more than half. For example, a composition that is predominantly a first constituent means more than half of the composition is the first constituent. The term "primarily" means the most, or greatest, part. For example, a composition that is primarily a first constituent means the composition has more of the first constituent than any other constituent. A composition that is primarily first and second constituents means the composition has more of the first and second constituents than any other constituent.

Unless otherwise specified, the use of the ordinal adjectives "first," "second," and "third," etc., to describe a common object, merely indicate that different instances of like objects to which are being referred and are not intended to imply that the objects so described must be in a given sequence, either temporally, spatially, in ranking, or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

Views labeled "cross-sectional," "profile," and "plan" correspond to orthogonal planes within a cartesian coordinate system. Thus, cross-sectional and profile views are taken in the x-z and y-z planes, and plan views are taken in the x-y plane. Typically, profile views in the x-z plane are cross-sectional views. Where appropriate, drawings are labeled with axes to indicate the orientation of the figure.

Materials, structures, and techniques are disclosed to improve die density in multichip composite devices. A multichip composite device may have a number of chips or dies that are integrated and formed into a quasi-monolithic structure. For example, a quasi-monolithic structure may be a structure that integrates integrated circuit (IC) or other dies and couples base dies and other dies, chiplets, and the like to form a composite structure of a system, such as a processing system. As a composite structure, a multichip composite device has multiple components, such as chips, including active dies; dielectric material on and between the chips; and metallization layers coupled to the chips. Furthermore, a handle die or carrier may be attached to the multichip composite device, and the handle die or carrier may be part of the quasi-monolithic structure.

Chip (or die) thicknesses can be reduced and device densities increased by separating the thickest metallization layers from dies in multichip devices and stacking the dies over the thickest metallization layers, which may be in a standalone die. Dies may be coupled over the metallization layers, or the metallization layers may be coupled or formed over the dies. Splitting the metallization layers into on- and off-die stacks provides manufacturing flexibility. The split-out or off-die metallization layers can be processed separately at the wafer level or built up over dies bonded in a composite device. The off-die metallization layers can be processed as a separate die or using a handle die or carrier as a substrate. Dies can be manufactured using different process flows and bonded together, e.g., in a dense stack. The dies can be encapsulated in an inorganic dielectric material and densely interconnected with through-dielectric vias (TDVs) through the inorganic dielectric material. The reduced-thickness dies allow the inorganic dielectric material to be thinner and associated TDVs to be shorter. Packaging the dies in inorganic dielectric material protects the dies, vias, their interconnections, etc. and allows for, e.g., hybrid bonding and high-temperature annealing. Reducing die thicknesses lowers stresses caused by, e.g., differing thermal-expansion rates. A structural substrate may be used, as necessary, to provide mechanical strength to the thin dies. Hybrid bonding and wafer-level processing of the metallization layers enables a very fine interconnect pitch. Device density can be improved by sharing metallization layers amongst dies and interconnecting dies between metallization layers above and below dies. Other device interconnections can be included in a metallization die. More dies and metallization layers can be stacked by providing device interconnections on backside metallization layers. Vias can be used for routing power and signals to the backside device interconnects.

Figure 1B:
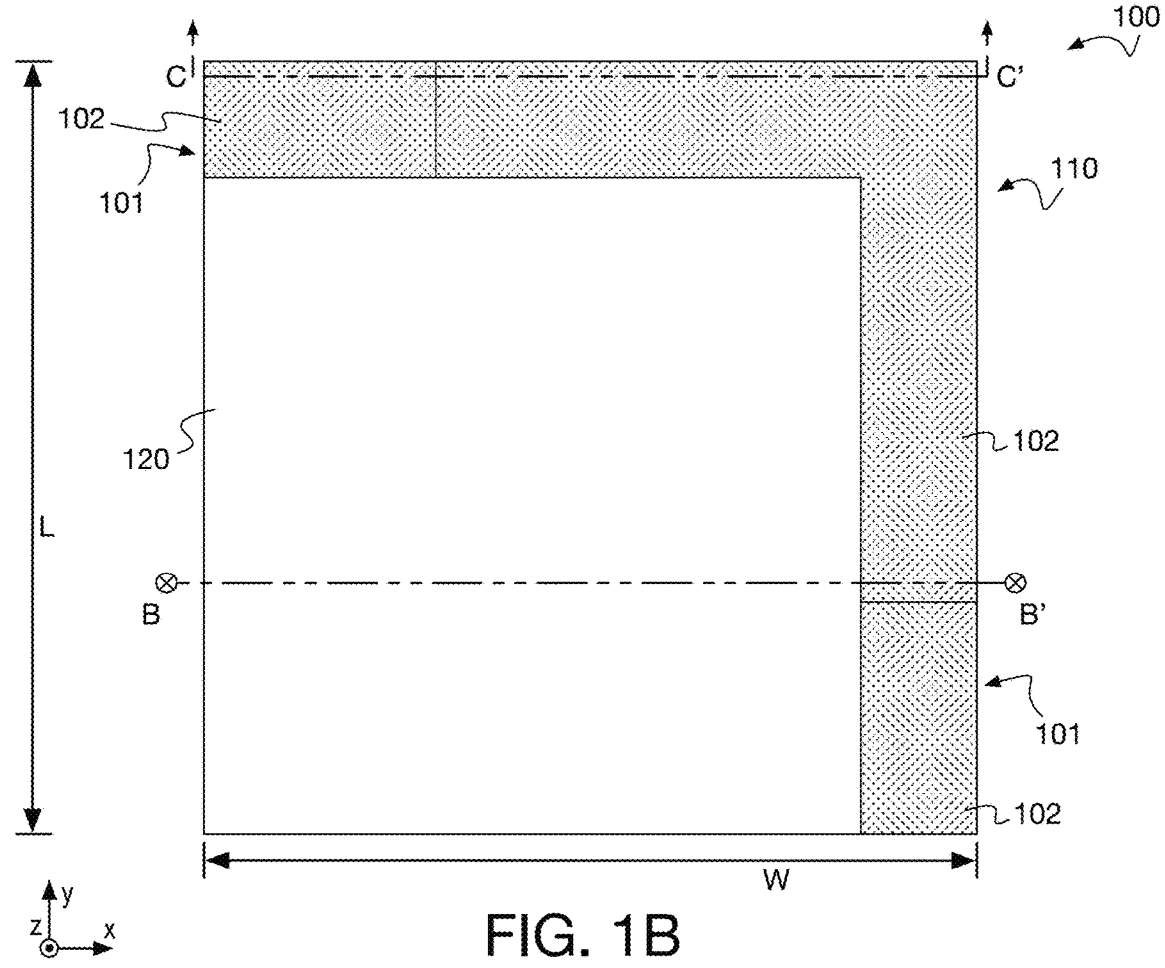
Figure 1C:
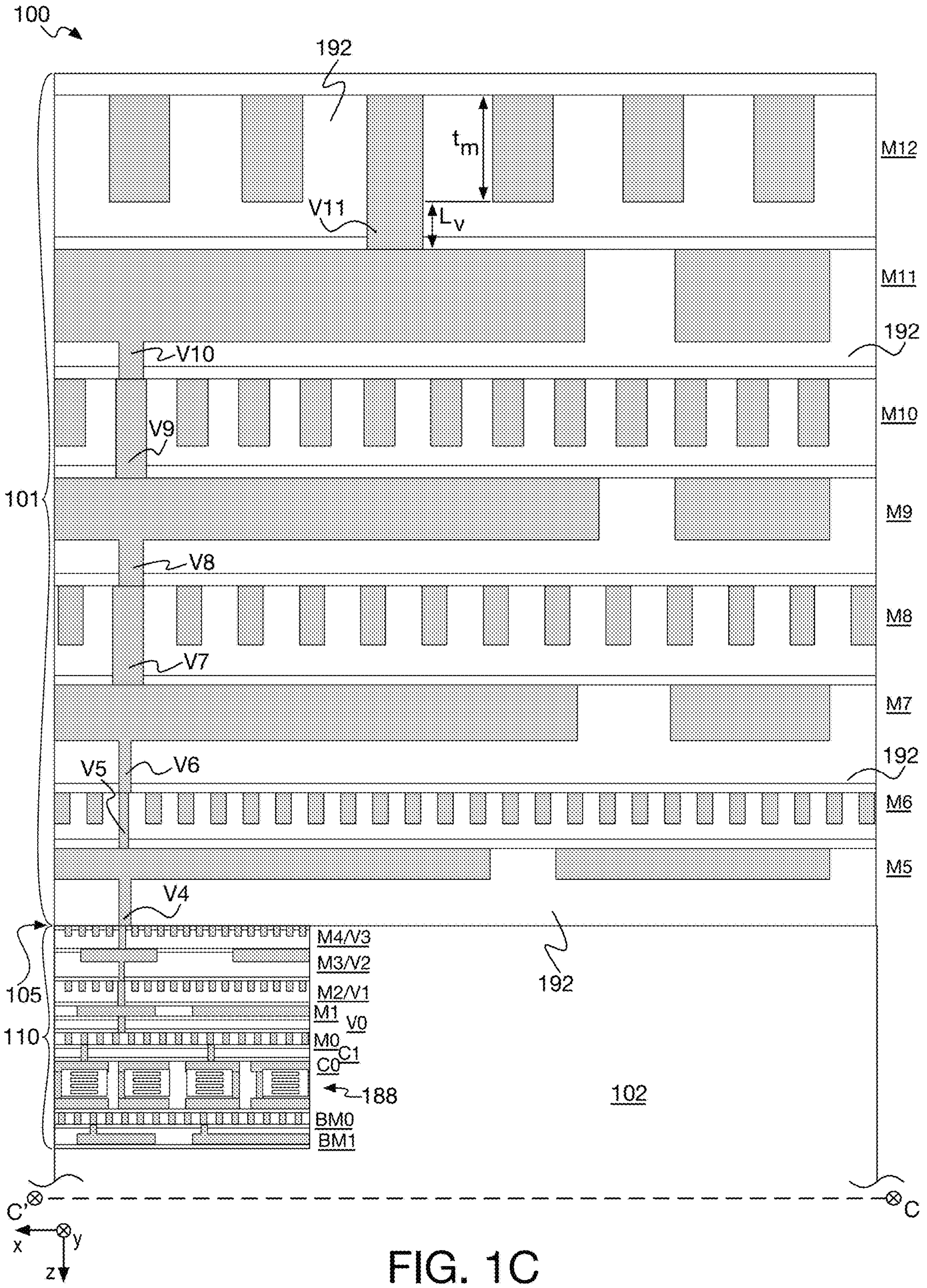

FIGS. 1A, 1B, and 1C illustrate cross-sectional profile and plan views of a multichip composite device 100, including metallization layers 101 coupled to a first die 110 and a second die 120, in accordance with some embodiments. FIG. 1A shows a cross-sectional profile view of multichip composite device 100 and the cross-sectional view line B-B'. FIG. 1B shows a cross-sectional plan view B-B' of multichip composite device 100 and cross-sectional view line C-C'. FIG. 1C shows a cross-sectional profile view C-C' of multichip composite device 100.

FIG. 1A shows multichip composite device 100 with an inorganic dielectric material 102 over a portion of a group of intradevice metallization layers 101. Inorganic dielectric material 102 is laterally adjacent first die 110, and between stack of metallization layers 101 and second die 120. Inorganic dielectric material 102 is also between first die 110 and a structural substrate 155, and laterally adjacent second die 120. Second die 120 is at a second level of multichip composite device 100 and over a portion of first die 110, which is at a first level below the second level, and over a portion of inorganic dielectric material 102. Structural substrate 155 is over second die 120 and spans the width and lateral area spanned by metallization layers 101. Multiple first-level, TDVs 103 extend through a portion of inorganic dielectric material 102 and couple metallization layers 101 to second die 120. The stack of metallization layers 101 includes multiple device-level interconnect interfaces 108 on its lower side, opposite first die 110. Device-level interconnect interfaces 108 (represented by metallization blocks) couple metallization layers 101 to a system substrate 199, and at least one of metallization layers 101 is coupled through system substrate 199 to a power supply (not shown).

First die 110 is coupled to at least the uppermost metallization layer 101A of the stack of metallization layers 101 at an interface 105. In some embodiments, first die 110 is hybrid bonded to the uppermost layer of the stack of metallization layers 101, and interface 105 is a hybrid-bond interface. In some such embodiments, a bond pad on a surface of first die 110 is bonded to a bond pad on a surface of metallization layers 101. In some embodiments, a metallization structure, e.g., via V4, at the bottom of the stack of metallization layers 101 contacts a metallization structure, e.g., an M4 line, at the top of first die 110. In some such embodiments, there is no bond pad (or a single bond pad) at interface 105 between first die 110 and metallization layers 101. Second die 120 is over first die 110 and coupled to first die 110 at their overlap. In the embodiment of FIG. 1A, first die 110 and second die 120 are hybrid bonded at a hybrid-bond interface 115.

First and second dies 110, 120 may include passive and/or active devices and multiple intradie metallization layers. Intradie metallization layers, like those within first and second dies 110, 120, do not extend laterally outside a die footprint. Interdie metallization layers, in contrast, extend laterally beyond one or more edges of a die and outside a die footprint. Metallization layers 101 coupled to first die 110 are intradevice metallization layers within multichip composite device 100 but may include interdie metallization layers, layers that are for more than a single die. Such interdie metallization layers can extend laterally beyond one or more edges of multiple dies and between multiple die footprints. Intradevice metallization layers do not extend laterally outside a device footprint, but may be interdie metallization layers. In some embodiments, metallization layers 101 include metallization layers only needed or used by, e.g., first die 110. In some embodiments, metallization layers 101 include metallization layers shared by first and second dies 110, 120. For example, power or signal lines can route from the bottom of first die 110 through metallization layers 101 and first-level TDVs 103 to second die 120. In some embodiments, power or signal lines can route from the top of first die 110 through hybrid-bond interface 115 to second die 120. Power or signals can route from off-device to first or second dies 110, 120 through metallization layers 101.

FIG. 1B shows a cross-sectional plan view B-B' of one embodiment of multichip composite device 100 shown in FIG. 1A. The viewing plane is at a top surface of second die 120, which is adjacent to inorganic dielectric material 102. First die 110 is below second die 120 and can be seen through inorganic dielectric material 102. Metallization layers 101 are below first die 110 and can be seen through inorganic dielectric material 102. First-level TDVs 103 (not shown) extend through inorganic dielectric material 102 under second die 120 and couple metallization layers 101 to second die 120 within the area of multichip composite device 100 spanned by metallization layers 101. Structural substrate 155 (not shown) is behind the viewing plane, over second die 120 and inorganic dielectric material 102.

Metallization layers 101 extend beyond first and second dies 110, 120 in both the x and y directions. First and second dies 110, 120 are fully within the area of multichip composite device 100 spanned by metallization layers 101. For example, metallization layers 101 may have an area within multichip composite device 100 defined by a width W and a length L. The length of first die 110 is less than, and completely included within, the length L of metallization layers 101. The width of first die 110 is less than, and completely included within, the width W of metallization layers 101. Likewise, the length of second die 120 is less than, and completely included within, the length L of metallization layers 101, and the width of second die 120 is less than, and completely included within, the width W of metallization layers 101. In some embodiments, first and second dies 110, 120 are arranged entirely within the defined area such that no edge of first and second dies 110, 120 extends beyond the edges of metallization layers 101. In other embodiments, first or second dies 110, 120 extend beyond the area of metallization layers 101 (W×L). In some embodiments, metallization layers 101 substantially occupy the area of multichip composite device 100, and the area of metallization layers 101 (W×L) defines the area of multichip composite device 100. In some embodiments, structural substrate 155 also shares the area (W×L) such that edges of metallization layers 101 and the edges of structural substrate 155 are substantially vertically aligned.

FIG. 1C shows a cross-sectional profile view C-C' of a portion of the embodiment of multichip composite device 100 shown in FIG. 1A. The viewing plane of FIG. 1C is behind the viewing plane of FIG. 1A, and the orientation is rotated to show first die 110 with a backside (and backside metals BM0 and BM1) on the bottom. Metallization layers 101 and its thickest metallization layer are shown at the top. While FIGS. 1A and 1C are not necessarily to scale, the scale of FIG. 1C is adjusted to highlight that upper metallization layers may be much thicker than lower metallization layers. Inorganic dielectric material 102 (not shaded in FIG. 1C) is laterally adjacent first die 110. Active device layer 188 is shown on the bottom of a frontside of first die 110, above the backside (e.g., backside metals BM0 and BM1). A highest metallization layer, M4, at the top of first die 110 is lower and thinner than a lowest metallization layer, M5, at the bottom of metallization layers 101.

Metallization layers 101 may have some similarities with IC dies. For example, metallization layers 101 may resemble the upper metallization layers in a typical IC die. In some embodiments, metallization layers 101 include layers of thick metal interspersed within one or more insulator materials. In some such embodiments, the metal is copper. In other embodiments, the metal is aluminum. In some embodiments, more than one metal is used.

As shown in FIG. 1C, metallization layers 101 include multiple metal lines (in layer M5 through M12) within an insulator material(s) 192 and connected by metal via structures (labelled V4 through V11). In some embodiments, insulator material 192 is a dielectric material. In some embodiments, insulator material 192 is the same material as, or includes, inorganic dielectric material 102. In some embodiments, insulator material 192 includes silicon and oxygen, e.g., silicon dioxide. In some embodiments, insulator material 192 includes silicon and nitrogen, e.g., silicon nitride. In some embodiments, insulator material 192 is a composite material, e.g., having alternating layers of two or more materials. In some embodiments, insulator material 192 includes silicon, oxygen, and nitrogen. Other materials may be used.

In some embodiments, similar to many IC dies, metallization layers 101 are a stack of layers where the uppermost layer is the thickest, the lowermost layer is the thinnest, and each layer is as thick or thicker than the layer below. In some embodiments, metallization layer pitches for individual metallization layers 101 are 0.5 μm thick and thicker. Metallization layer dimensions can be defined by at least a couple of parameters. A metal line thickness, $t_m$, is defined as the vertical distance from a bottom to a top of the substantially horizontal metal line. A via length, $L_v$, is defined as the vertical distance spanned by a via between vertically adjacent metal lines, i.e., from a bottom of a substantially horizontal metal line to a top of the substantially horizontal metal line below. A metallization layer pitch is defined as the vertical distance from a top of a substantially horizontal metal line to a top of the substantially horizontal metal line below, i.e., for a given metallization layer, the metal line thickness, $t_m$, plus the via length, $L_v$. For example, a metallization layer, e.g., M10 in metallization layers 101, might have a metal line thickness ($t_m$) of 4 μm, a via length ($L_v$) of 2 μm, and a metallization layer pitch of 6 μm.

As shown in FIG. 1C, removing metallization layers from first or second dies 110, 120 to be implemented as part of metallization layers 101 enables thinner first and second dies 110, 120, which can enable processing methods and flexibility, as well as thinner multichip composite devices 100. For example, since the manufacture of inorganic dielectrics can be relatively slow and inefficient, e.g., at die-level dimensions, thinner dies and thinner dielectrics enable, or make less costly, the use of inorganic dielectric materials. Thinner dies also facilitate the use of inorganic dielectric materials by reducing stresses caused by thermal expansion of differing materials. Mechanical stresses from differing expansion rates are lessened by reducing material heights or thicknesses. The use of inorganic dielectric materials enables processing methods, e.g., metallization techniques, such as damascene, and high-temperature anneals, foreclosed by the lower temperature constraints of many organic dielectrics. Thinner dielectrics also translate to shorter via lengths, e.g., shorter TDVs, which results in reduced electrical signal path lengths (and, hence, reduced electrical resistances), but also reduced processing times for forming via structures, including reduced etching and metal deposition times. As with electrical resistances, thermal resistances, e.g., from heat-producing dies to heat-removing structures, are reduced by reducing dielectric thicknesses. Removing, e.g., metallization layers from first or second dies 110, 120 and deploying them in metallization layers 101 can also provide routing flexibility as interconnections, e.g., between dies, can be implemented in metallization layers 101 instead of, e.g., a package substrate or interposer. Die-level processing further enables additional features, such as finer pitches, e.g., between metallization interconnections and other structures.

In many IC dies, most of a die's thickness comes from the thickest metallization layers. In some embodiments, first or second dies 110, 120 are less than 10 μm thick. In some embodiments, first or second dies 110, 120 are less than 4 μm thick. In some embodiments, the thickest intradie metal line thickness ($t_m$) of first or second dies 110, 120 is less than 2 μm. Removing the thickest metallization layers from first or second dies 110, 120 can enable yet thinner first and second dies 110, 120. In some embodiments, first or second dies 110, 120 are less than 2 μm thick. In some embodiments, the thickest intradie metal line thickness ($t_m$) of first or second dies 110, 120 is less than 1 μm. In some embodiments, the thickest intradie metal line thickness ($t_m$) of first or second dies 110, 120 is less than 750 nm or less than 500 nm. In some embodiments, first or second dies 110, 120 are less than 1 μm thick. In some embodiments, the thinnest metal line thickness ($t_m$) within stack of metallization layers 101 is thicker than the thickest intradie metal line thickness ($t_m$) of first or second dies 110, 120. In some embodiments, the thinnest metal line thickness ($t_m$) of metallization layers 101 is 1 μm. In some embodiments, the thinnest metal line thickness ($t_m$) of metallization layers 101 is 500 nm or 750 nm. More of the metallization layers can be removed from first or second dies 110, 120 and deployed in metallization layers 101 to minimize thicknesses of first or second dies 110, 120. In some embodiments, first or second dies 110, 120 are less than 750 nm thick. In some embodiments, first or second dies 110, 120 are less than 500 nm thick.

Returning to FIGS. 1A and 1B, since first or second dies 110, 120 may be very thin, structural substrate 155 can be used to provide mechanical strength to multichip composite device 100. In some embodiments, structural substrate 155 spans the entire area of multichip composite device 100. Advantageously, structural substrate 155 is of a thermally conductive material such that heat may be transferred from dies 110, 120 to an external heat spreader, heat sink, heat pipe or other heat removal device. Structural substrate 155 may be a crystalline material. In some embodiments, structural substrate 155 is predominantly crystalline silicon. For example, structural substrate 155 may be silicon diced from a silicon wafer. In some embodiments, structural substrate 155 is a crystalline material of silicon and carbon (such as silicon carbide), aluminum and oxygen (such as $Al_2O_3$ or sapphire), or a crystalline III-V material. Exemplary III-V materials include gallium and arsenic or nitrogen, such as gallium arsenide or gallium nitride. Other elements from Groups III and V may be used.

Structural substrate 155 may be coupled to multichip composite device 100 by any suitable means. In some embodiments, structural substrate 155 is coupled by a bond, such as a surface-activated bond, to inorganic dielectric material 102 over second die 120 (as shown). In some embodiments, inorganic dielectric material 102 is laterally adjacent to, but not over, second die 120. In some such embodiments, structural substrate 155 is bonded, such as direct or fusion bonded, directly to second die 120. In some such embodiments, second die 120 is predominantly silicon and is surface-activated bonded to structural substrate 155 of predominantly silicon, silicon carbide, gallium arsenide, or aluminum oxide. In some such embodiments, second die 120 is predominantly gallium arsenide and is surface-activated bonded to structural substrate 155 of predominantly silicon carbide. In some such embodiments, second die 120 is predominantly gallium arsenide or aluminum oxide and is surface-activated bonded to structural substrate 155 of predominantly silicon. In some such embodiments, second die 120 is predominantly aluminum oxide and is surface-activated bonded to structural substrate 155 of predominantly aluminum oxide. In some embodiments, with or without inorganic dielectric material 102 over second die 120, structural substrate 155 is coupled to multichip composite device 100 with an intermediate bonding layer. An intermediate bonding layer may include any suitable materials. In some embodiments, an intermediate bonding layer includes copper, silicon, or silicon nitride. Other materials may be used.

Inorganic dielectric material 102 may be any suitable material or combination of materials. An inorganic dielectric material is a dielectric material that lacks carbon-hydrogen bonds. Multiple materials may be used, e.g., to tune characteristics to sufficient or more desirable values. One or more materials may be used at one level, e.g., laterally adjacent first die 110, and one or more different materials may be used at a second level, e.g., laterally adjacent second die 120. Many inorganic materials have benefits relative to organic alternatives, e.g., higher thermal conductivity and moisture resistance. Advantageously (e.g., relative to a packaging material or mold compound), inorganic dielectric material 102 can withstand high temperatures and be conveniently formed. In some embodiments, inorganic dielectric material 102 includes a crystalline material. In some embodiments, inorganic dielectric material 102 includes silicon and oxygen. In some such embodiments, inorganic dielectric material 102 is predominantly silicon dioxide, which is a material convenient for many semiconductor manufactures and which can handle high temperatures. Unlike many organic materials, e.g., plastic mold compounds, many inorganic materials are able to withstand high-temperatures. Such materials can be present, e.g., when processing or adding metallization structures in or to multichip composite device 100 and when annealing, e.g., for direct bonding an additional die or substrate to multichip composite device 100. Advantageously, inorganic dielectric material 102 has good strength. In some embodiments, inorganic dielectric material 102 includes silicon and nitrogen. In some such embodiments, inorganic dielectric material 102 is predominantly silicon nitride, which is another convenient material with very high strength and which can handle extremely high temperatures. In some embodiments, inorganic dielectric material 102 includes combinations of dielectric materials. In some such embodiments, inorganic dielectric material 102 includes silicon dioxide and silicon nitride, e.g., in alternating layers. Other materials may be used.

Hybrid bonds may include direct (or fusion) bonds, e.g., of metallization structures to other metallization structures, such as of copper to copper. Hybrid bonds may include direct bonds between crystalline or other materials, e.g., of silicon to silicon. Hybrid bonds may include direct or surface-activated bonds between other materials, including dissimilar materials, such as of silicon to silicon dioxide. In some embodiments, hybrid bonds between structures include bonds between metallization structures and between crystalline materials. For example, in some such embodiments, hybrid bonds between, e.g., first and second dies 110, 120 include direct copper-copper and silicon-silicon bonds.

Device-level interconnect interfaces 108 may be any of various suitable structures. In some embodiments, device-level interconnect interfaces 108 are exposed metal portions of metallization layers 101, e.g., the top (or bottom) of a thick metal layer, and are substantially flush with an underside of metallization layers 101. Device-level interconnect interfaces 108 may be terminations of substantially vertical metallization structures extending from metallization structures extending horizontally through metallization layers 101, e.g., the end of a via connection extending vertically from a thick metal layer. In some embodiments, device-level interconnect interfaces 108 are, e.g., metal pads on such terminations, such as bond pads. In some embodiments, device-level interconnect interfaces 108 include materials, e.g., solder, for forming bonds with, e.g., system substrate 199. Device-level interconnect interfaces 108 may be planarized surfaces for hybrid bonding. In some embodiments, device-level interconnect interfaces 108 have fine pitches and other dimensions at a scale smaller than, e.g., conventional package substrates.

Figure 2A:
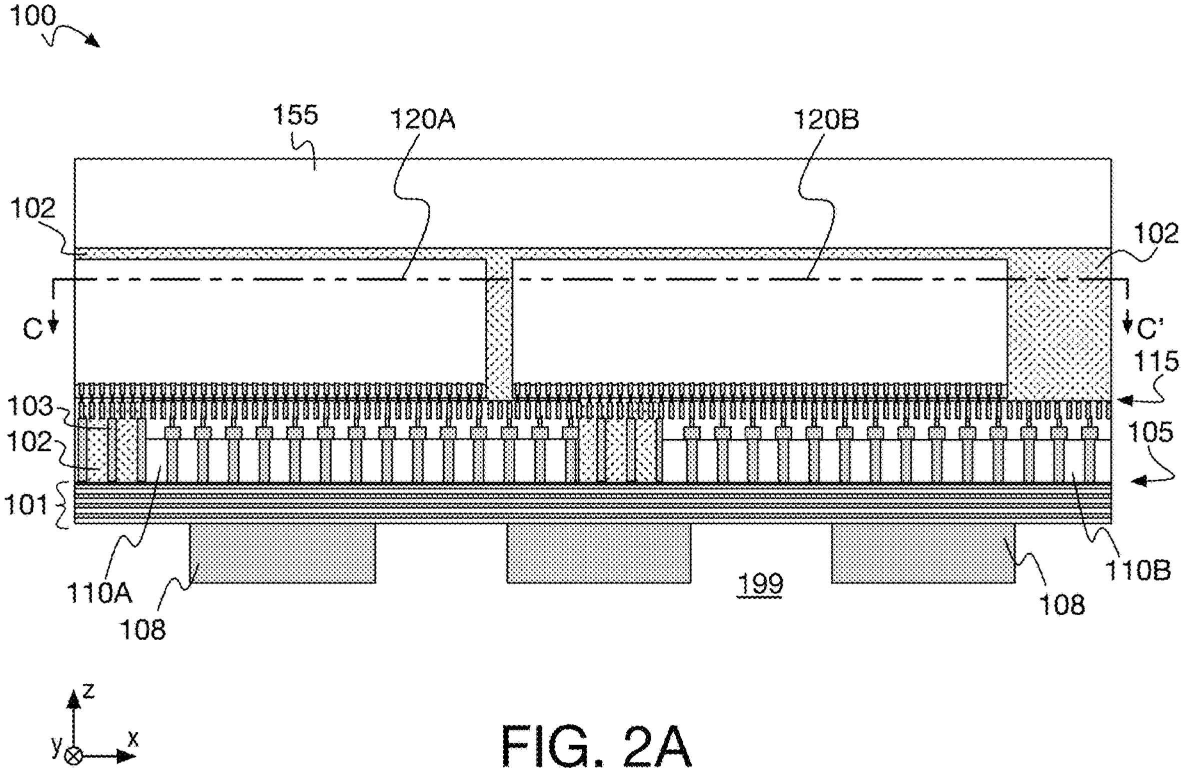
FIGS. 2A, 2B, 2C and 2D illustrate cross-sectional profile and plan views of a multichip composite device, including metallization layers coupled to multiple dies.
Figure 2B:
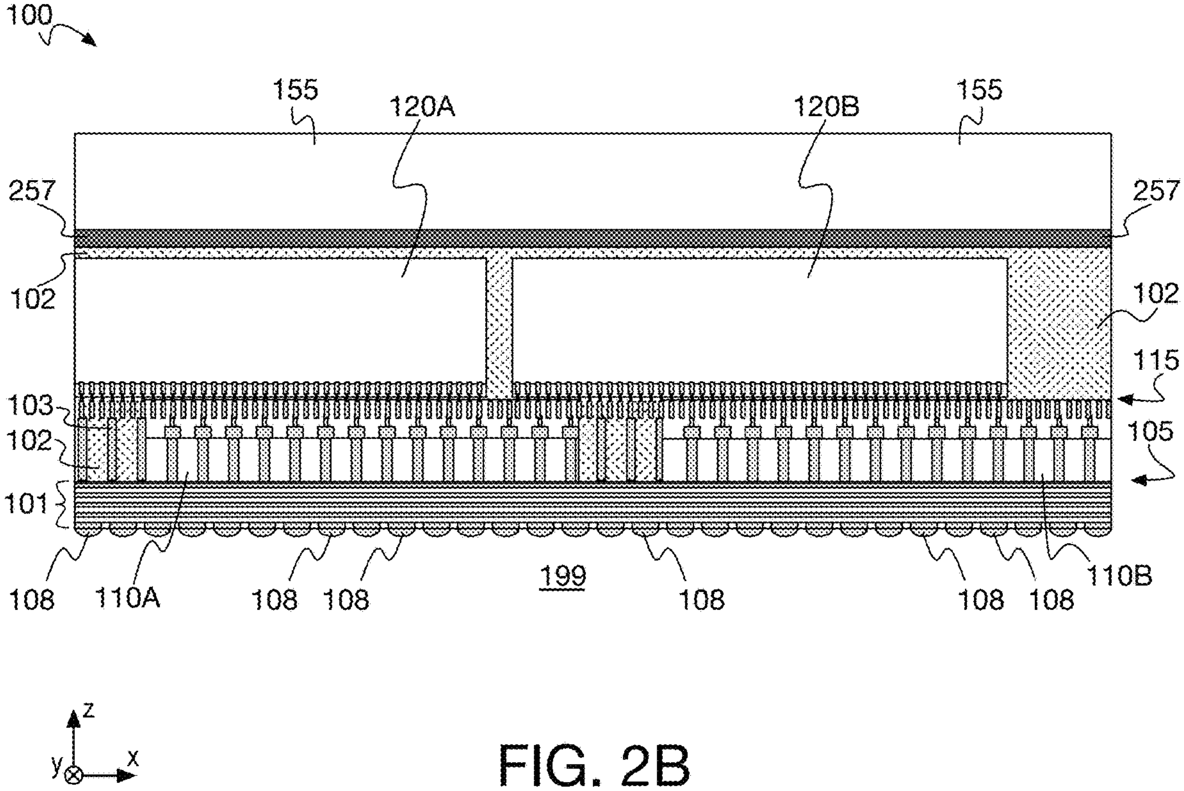
Figure 2C:
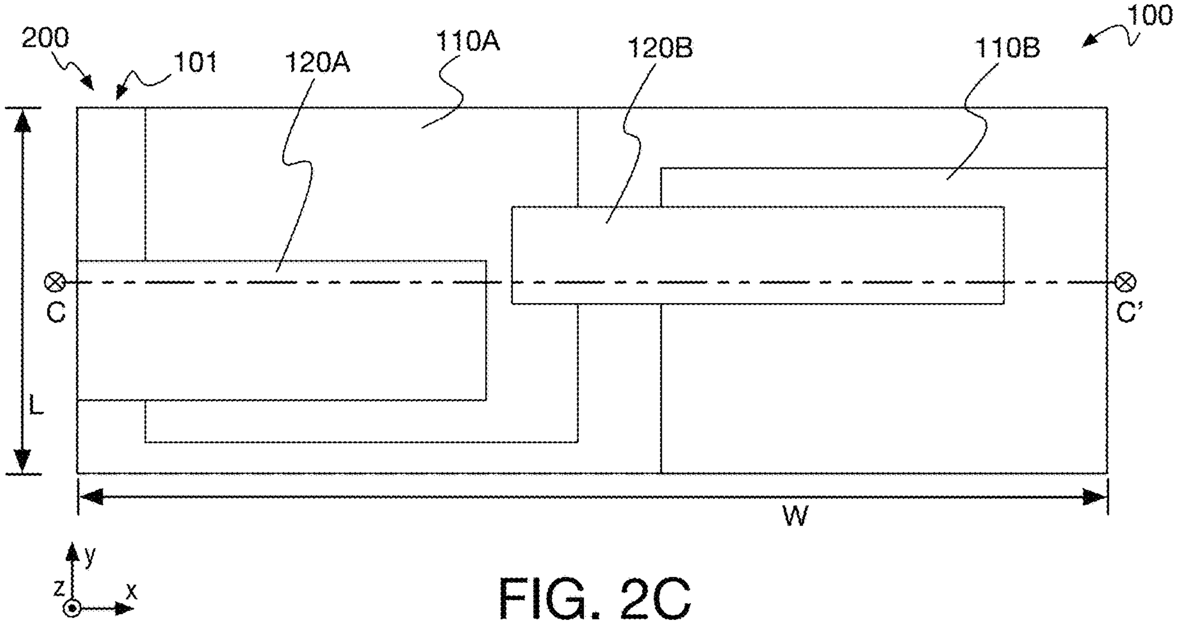
Figure 2D:
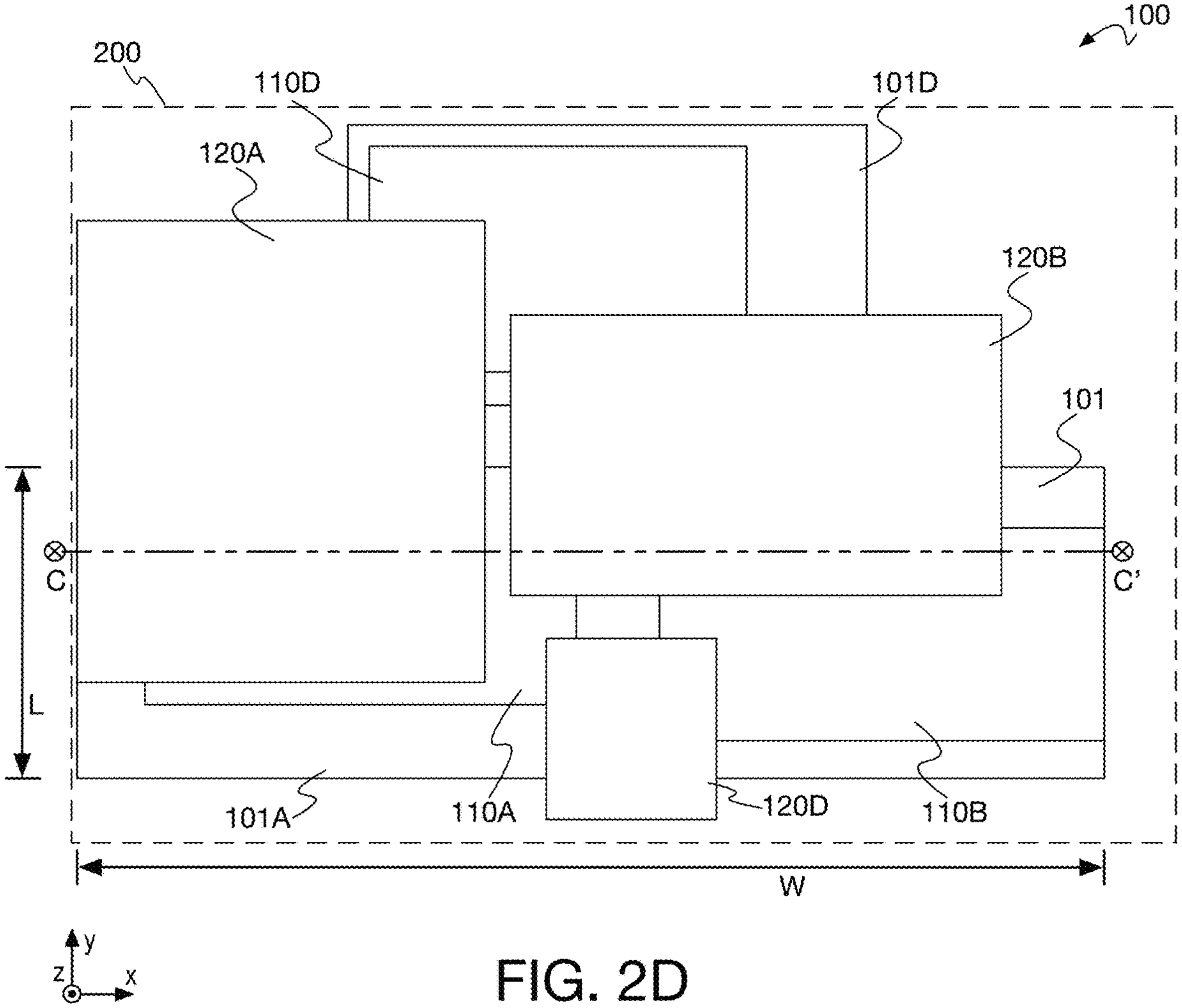

FIGS. 2A, 2B, 2C and 2D illustrate cross-sectional profile and plan views of multichip composite device 100, including metallization layers 101 coupled to multiple dies, in accordance with some embodiments. FIG. 2A shows a cross-sectional profile view of multichip composite device 100 with multiple dies at multiple levels above metallization layers 101 and the cross-sectional view line C-C'. FIG. 2B shows a cross-sectional profile view of a similar multichip composite device 100 with a fine-pitch array of device-level interconnect interfaces 108. FIG. 2C shows a cross-sectional plan view C-C' of multichip composite device 100 with multiple dies at multiple levels above metallization layers 101. FIG. 2D shows a cross-sectional plan view C-C' of another embodiment of multichip composite device 100 with additional dies at multiple levels above metallization layers 101 and a larger area.

In the example of FIG. 2A, multichip composite device 100 again includes first and second dies 110A, 120A hybrid bonded at hybrid-bond interface 115 and first and second dies 110A, 120A within an area of, and coupled to, metallization layers 101. Additionally, multichip composite device 100 includes a third die 110B coupled to metallization layers 101. In some embodiments, first die 110 and third die 110B are hybrid bonded to metallization layers 101. Third die 110B is over metallization layers 101 and laterally adjacent inorganic dielectric material 102, which is between first die 110A and third die 110B. Multichip composite device 100 also includes a fourth die 120B over a portion of, and hybrid bonded to, third die 110B. Fourth die 120B is also over a portion of, and hybrid bonded to, first die 110A. Like second die 120A, fourth die 120B is over a portion of inorganic dielectric material 102 and is coupled to metallization layers 101 by a group of first-level TDVs 103 through inorganic dielectric material 102. Device-level interconnect interfaces 108 (represented by metallization blocks) couple metallization layers 101 to a power supply (not shown) through system substrate 199.

In some embodiments, metallization layers 101 spans multiple upper-level dies, e.g., second and fourth dies 120A, 120B, that overlap a portion of a lower-level die, e.g., first die 110A. In some such embodiments, upper-level dies extend beyond the lower-level die in both lateral dimensions. In this way, e.g., four memory dies may be over, and coupled to, e.g., a central processor die. In other embodiments, metallization layers 101 spans multiple lower-level dies, e.g., first and third dies 110A, 110B, that overlap a portion of an upper-level die, e.g., fourth die 120B. In this way, e.g., a central processor die may be over, and coupled to, e.g., four memory dies.

In the example of FIG. 2B, an embodiment of multichip composite device 100 is shown with a fine-pitch array of device-level interconnect interfaces 108 on an underside of metallization layers 101. In some embodiments, device-level interconnect interfaces 108 are bond pads with solder bumps.

FIG. 2B shows an optional intermediate bonding layer 257. Intermediate bonding layer 257 may facilitate better coupling of structural substrate 155 to multichip composite device 100. For example, in some embodiments, silicon is sputtered onto structural substrate 155 to provide for a surface-activated bond with inorganic dielectric material 102 or one or more second dies 120. In some embodiments, inorganic dielectric material 102 includes silicon dioxide, structural substrate 155 is predominantly silicon, and intermediate bonding layer 257 includes silicon. In some embodiments, inorganic dielectric material 102 includes silicon dioxide, structural substrate 155 is predominantly silicon carbide, and intermediate bonding layer 257 includes silicon. Although shown in FIG. 2B, the layer of inorganic dielectric material 102 over second dies 120 may be removed or thinned to reduce the thermal resistance between potentially heat producing first and second dies 110, 120 and any heat removing structures, including structural substrate 155. In some embodiments, a thin layer of inorganic dielectric material 102 is over second dies 120, and intermediate bonding layer 257 is predominantly copper. In some such embodiments, inorganic dielectric material 102 is predominantly silicon dioxide. In some embodiments, inorganic dielectric material 102 is planarized to a level with top surfaces of second dies 120. In some such embodiments, structural substrate 155 is coupled to second dies 120. Top surfaces of second dies 120 may include a dielectric material, e.g., silicon dioxide, but in some embodiments, top surfaces of second dies 120 are predominantly semiconductor substrates. In some embodiments, structural substrate 155 is predominantly silicon, silicon carbide, gallium arsenide, or aluminum oxide, and intermediate bonding layer 257 includes silicon.

FIG. 2C shows a cross-sectional plan view C-C' of one embodiment of multichip composite device 100 shown in FIG. 2A, but inorganic dielectric material 102 is not shown for the sake of clarity of presentation. Metallization layers 101 extend beyond first, second, third, and fourth dies 110A, 120A, 110B, 120B in both the x and y directions. First, second, third, and fourth dies 110A, 120A, 110B, 120B are fully within the area of multichip composite device 100 spanned by metallization layers 101. The lengths and widths of first, second, third, and fourth dies 110A, 120A, 110B, 120B are all less than, and completely included within, the length L and width W of metallization layers 101. Metallization layers 101 substantially occupy the area of multichip composite device 100, which has a perimeter 200, and the area of metallization layers 101 (W×L) defines the area of multichip composite device 100. Though not shown in the plan view of FIG. 2C, structural substrate 155 also shares the area (W×L) and perimeter 200 such that the edges of metallization layers 101 and the edges of structural substrate 155 are substantially vertically aligned.

FIG. 2D shows (again, without inorganic dielectric material 102) a cross-sectional plan view C-C' of an embodiment of multichip composite device 100 with additional dies and a larger area. Metallization layers 101 extend beyond first and third dies 110A, 110B in both the x and y directions. First and third dies 110A, 110B are fully within the area of multichip composite device 100 spanned by metallization layers 101.

Multichip composite device 100 has a perimeter 200, e.g., as defined by structural substrate 155 (not shown), which encircles an area greater than the area of metallization layers 101 (W×L). Second and fourth dies 120A, 120B extend beyond metallization layers 101 in the y direction. Second and fourth dies 120A, 120B are not fully within the area of multichip composite device 100 spanned by metallization layers 101. Second and fourth dies 120A, 120B are coupled to a fifth die 110D (on the first level), which is coupled to an additional stack of metallization layers 101D. A sixth die 120D is coupled to first and third dies 110A, 110B, but extends beyond metallization layers 101 in the y direction.

In some embodiments, in addition to providing mechanical strength, structural substrate 155 helps remove heat from multichip composite device 100, e.g., to a heat spreader, etc. Having more lateral area, e.g., more than metallization layers 101, can help structural substrate 155 dissipate heat from multichip composite device 100. Rather than being substantially vertically aligned with metallization layers 101, structural substrate 155 may define a larger perimeter 200 of multichip composite device 100 for at least this reason.

Figure 3:
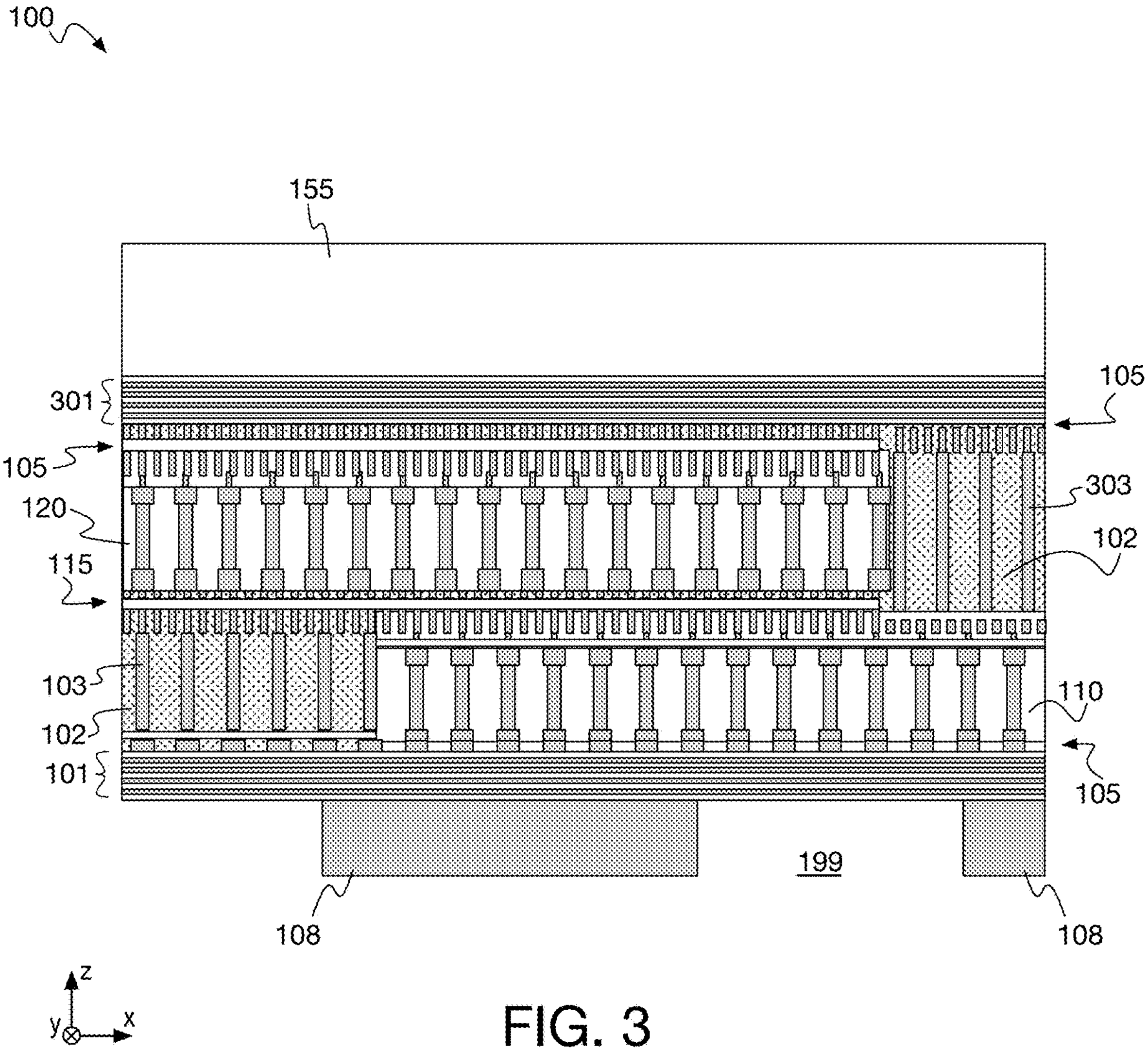
FIG. 3 illustrates a cross-sectional profile view of a multichip composite device, including both lower metallization layers and upper metallization layers coupled to first and second dies.

FIG. 3 illustrates a cross-sectional profile view of multichip composite device 100, including both lower metallization layers 101 and upper metallization layers 301 coupled to first and second dies 110, 120, in accordance with some embodiments. Multichip composite device 100 includes lower metallization layers 101 coupled to first die 110, as described above, and upper metallization layers 301 over second die 120. Second die 120 is coupled to a lowermost one of upper metallization layers 301. In some embodiments, second die 120 is hybrid bonded to metallization layers 301. Second die 120 is fully within an area of multichip composite device 100 spanned by upper metallization layers 301. Upper metallization layers 301 are coupled to first die 110 by one or more second-level TDVs 303. Lower metallization layers 101 are coupled to second die 120 by one or more first-level TDVs 103. Both first- and second-level TDVs 103, 303 extend through a portion of inorganic dielectric material 102 within an area of multichip composite device 100 spanned by their respective metallization layers 101, 301.

Upper metallization layers 301 enable further thinning of second die 120 and provide additional available interconnections, which allows for increased routing flexibility. A thinner second die 120 results in thinner inorganic dielectric material 102 above first die 110 and shorter second-level TDVs 303. Thinner inorganic dielectric material 102 means less processing time, including dielectric deposition time and etching time to form second-level TDVs 303. Shorter second-level TDVs 303 mean reduced electrical resistances and less processing time, e.g., less etching time and less deposition time. Electrical routing flexibility is provided as the upper side of second die 120 can now be accessed through second-level TDVs 303 and upper metallization layers 301 (instead of only through second die 120), which allows for more efficient use of the area and volume of second die 120.

Figure 4:
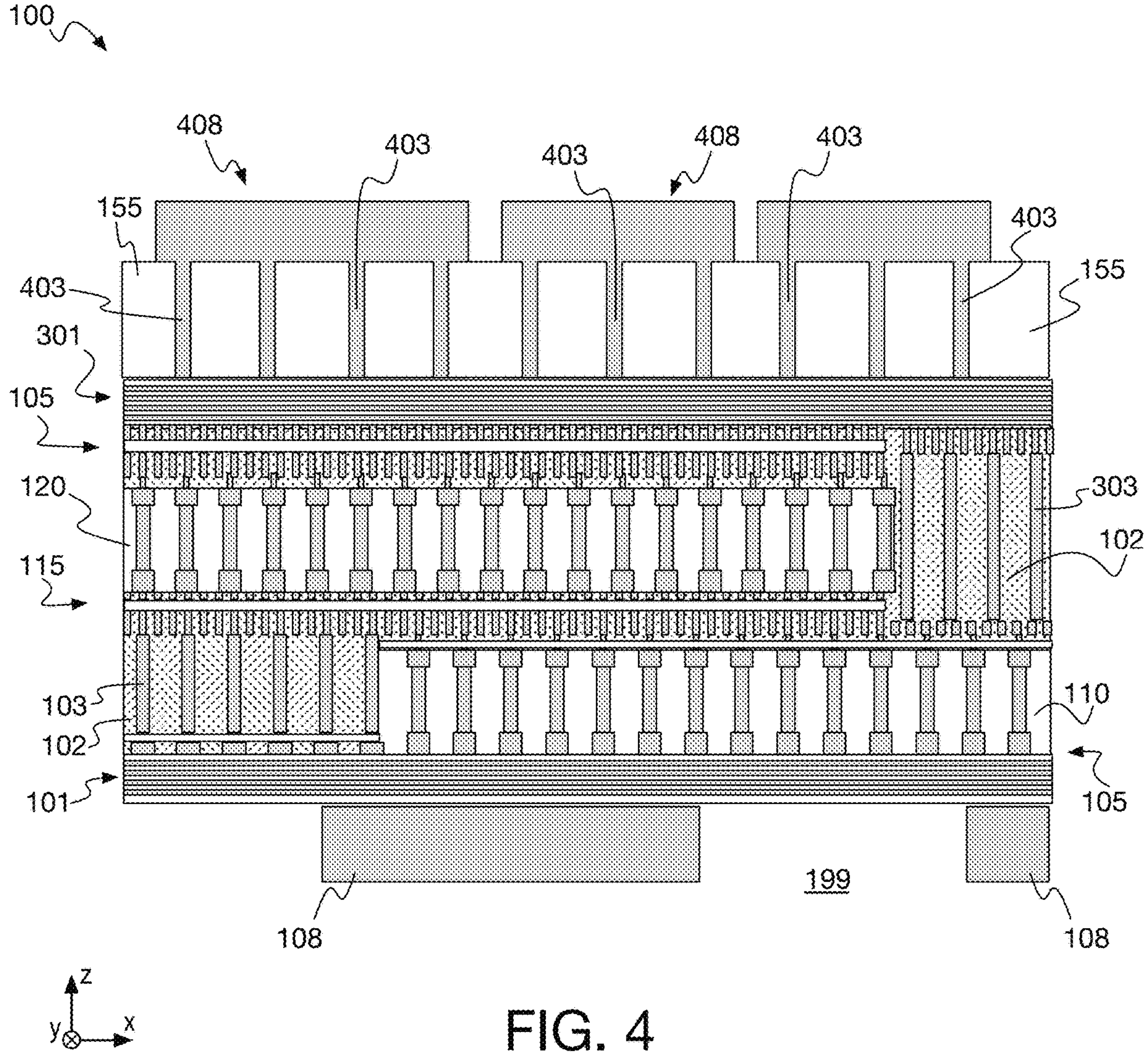
FIG. 4 illustrates a cross-sectional profile view of a multichip composite device, including both lower and upper metallization layers and lower and upper device-level interconnect interfaces coupled to multiple dies.

FIG. 4 illustrates a cross-sectional profile view of multichip composite device 100, including both lower and upper metallization layers 101, 301 and lower and upper device-level interconnect interfaces 108, 408 coupled to multiple dies, in accordance with some embodiments. Multichip composite device 100 includes a group of upper device-level interconnect interfaces 408 and structural substrate 155 over upper metallization layers 301. Upper metallization layers 301 are coupled to upper device-level interconnect interfaces 408 by one or more through-substrate vias (TSV) 403 extending through structural substrate 155.

Upper device-level interconnect interfaces 408 may couple multichip composite device 100 to other dies, metallization layers, or substrates and may deliver power or signals to or from multichip composite device 100. The additional interconnections may provide routing flexibility, as well as more power or signal density.

Figure 5:
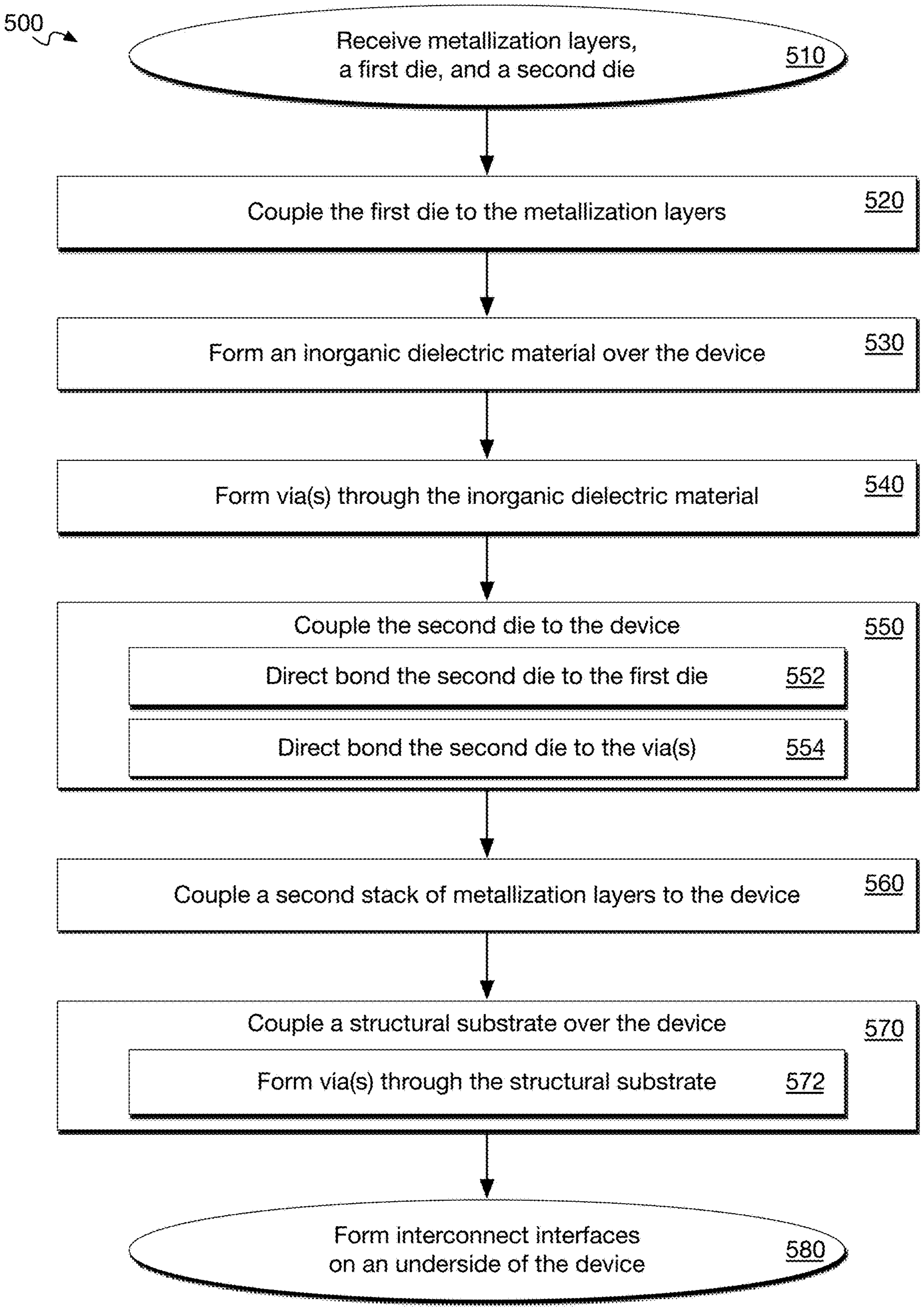
FIG. 5 illustrates various processes or methods for forming a multichip composite device with discrete metallization layers, including hybrid bonding dies and forming inorganic dielectric material over the multichip composite device.

FIG. 5 illustrates various processes or methods 500 for forming a multichip composite device with discrete metallization layers, including hybrid bonding dies and forming inorganic dielectric material over the multichip composite device, in accordance with some embodiments. FIG. 5 shows methods 500 that includes operations 510-580. Some operations shown in FIG. 5 are optional. FIG. 5 shows an example sequence, but the operations can be done in other sequences as well, and some operations may be omitted. Some operations can also be performed multiple times before other operations are performed. Some operations may be included within other operations. Methods 500 generally entail forming composite devices by bonding dies and metallization structures and by forming inorganic dielectric material over and beside structures.

Figure 6A:
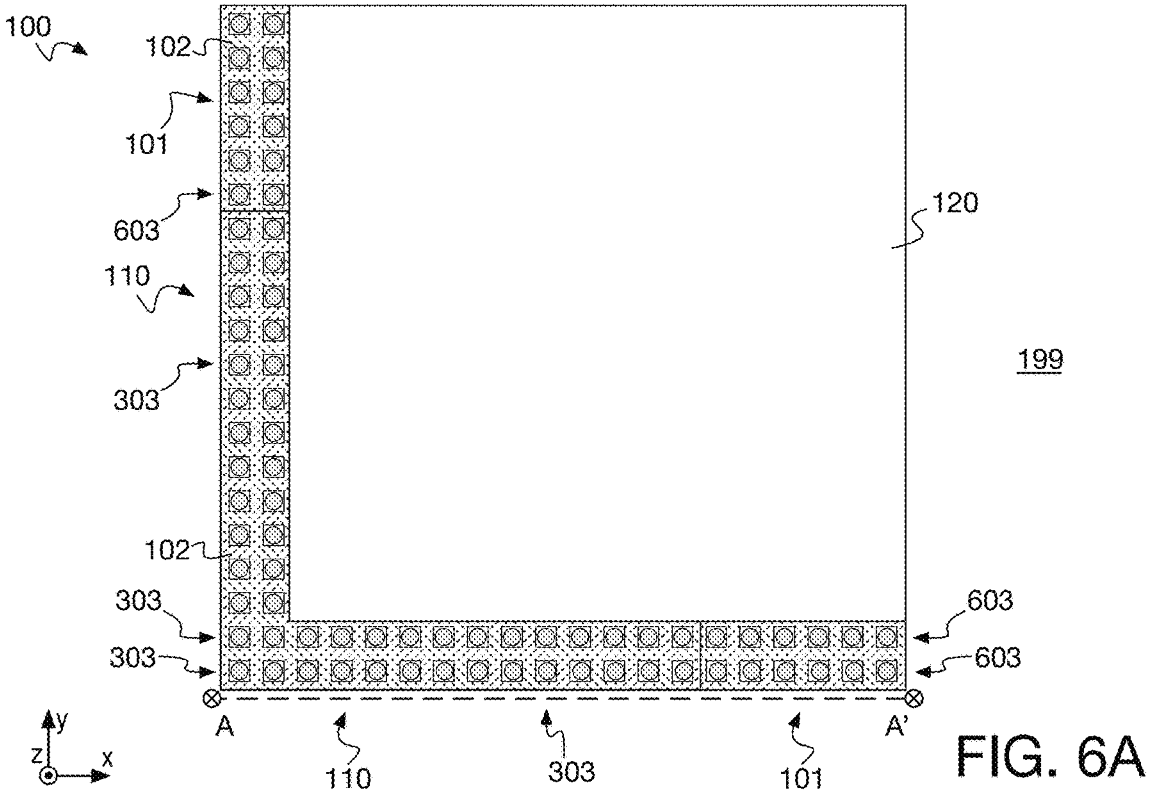
FIGS. 6A, 6B, 6C, 6D, 6E, 6F, 6G, 6H, and 6I illustrate isometric views of a multichip composite device, including lower and upper metallization layers and first and second dies, at various stages of manufacture.
Figure 6B:
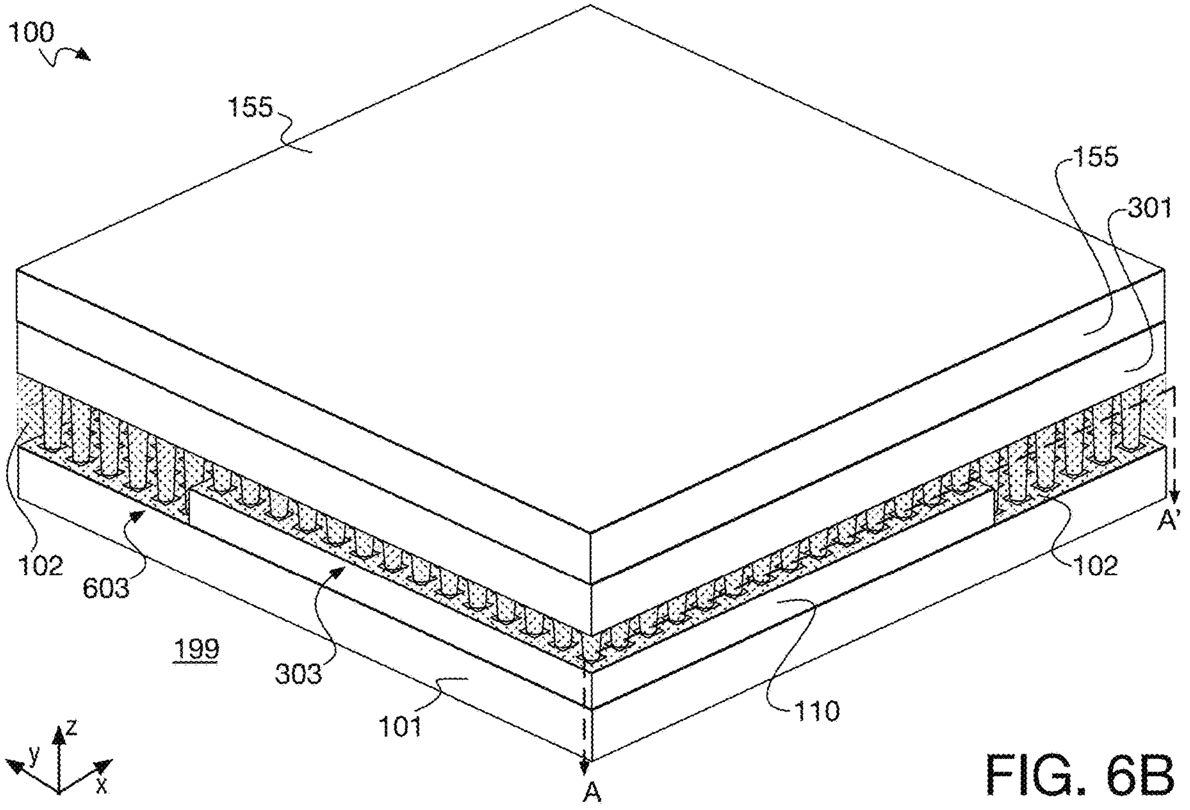

FIGS. 6A, 6B, 6C, 6D, 6E, 6F, 6G, 6H and 6I illustrate isometric views of multichip composite device 100, including lower and upper metallization layers 101, 301 and first and second dies 110, 120, at various stages of manufacture, in accordance with some embodiments. FIG. 6A shows a cross-sectional plan view A-A' of multichip composite device 100. FIG. 6B shows an isometric view of multichip composite device 100 and cross-sectional view line A-A'. As shown in FIGS. 6C-6H, lower and upper metallization layers 101, 301 and first and second dies 110, 120 are received and these and other structures are coupled to form multichip composite device 100. Inorganic dielectric material 102 is formed over multiple structures.

FIG. 6A shows a cross-sectional plan view A-A' of multichip composite device 100. The viewing plane is level with a top surface of second die 120. Inorganic dielectric material 102 is adjacent to second die 120. First die 110 is below second die 120 and can be seen through inorganic dielectric material 102. Lower metallization layers 101, below first die 110, extend beyond first die 110 in both the x and y directions and can be seen through inorganic dielectric material 102. First-level TDVs 103 (not shown) are under second die 120. Second-level TDVs 303 are over first die 110 and surrounded by inorganic dielectric material 102. The tops of second-level TDVs 303 are level with a top surface of second die 120. Two groups of tall TDVs 603 extend up from lower metallization layers 101 through the levels of first and second dies 110, 120. The tops of tall TDVs 603 are level with a top surface of second die 120. Lower metallization layers 101 are over, and coupled to, system substrate 199. Structural substrate 155 (not shown) and upper metallization layers 301 (not shown) are behind the perspective of the viewing plane (higher on the z axis), over second die 120 and inorganic dielectric material 102.

Some vias are shown as having a circular cross-section, e.g., as substantially cylindrical, but vias may any suitable shape.

FIG. 6B shows an isometric view of multichip composite device 100 and cross-sectional view line A-A'. First die 110 and inorganic dielectric material 102 are over lower metallization layers 101, which are over, and coupled to, system substrate 199. Second die 120 (not shown) and first-level TDVs 103 (not shown) are over first die 110 and under (and obscured by) upper metallization layers 301. Tall TDVs 603 and second-level TDVs 303 extend through inorganic dielectric material 102 to couple upper metallization layers 301 to lower metallization layers 101 and to first die 110, respectively. Tall TDVs 603 and second-level TDVs 303 (and first-level TDVs 103, not shown) may be substantially vertical. Some vias may have some taper. Structural substrate 155 is over, and coupled to, upper metallization layers 301. Below, FIGS. 6C-6H show the embodiment of FIG. 6B at various stages of manufacture.

Returning to FIG. 5, multiple metallization layers and multiple dies are received in operation 510. In some embodiments, lower and upper metallization layers and first and second dies are received. In some embodiments, the metallization layers are received in a single stack, e.g., lower metallization layers. In some embodiments, a structural substrate is received. The received metallization layers, dies, etc. may be in various stages of manufacture. In some embodiments, a single stack of metallization layers is formed, e.g., over the first and second dies after receiving the first and second dies. In some embodiments, metallization layers are formed over dies on a same level after the dies are coupled to a composite device. In some embodiments, metallization layers are formed over a surface of one or more dies and inorganic dielectric material, e.g., after the dies are coupled to a composite device and the inorganic dielectric material is planarized.

The metallization layers may be formed by any suitable means and with any suitable materials. In some embodiments, the metallization layers include copper or aluminum. The metallization layers may be formed much as metallization layers are formed, e.g., in IC dies. For example, some embodiments use damascene, dual-damascene, and other deposition processes. Physical vapor deposition (PVD) or sputter may be used. In some embodiments, PVD is used to form a layer, e.g., a seed layer, of a metal. Electroplating may be used. In some embodiments, electroplating is use to form a metal, e.g., copper, over a seed layer of the metal. One or more barrier layers, e.g., a relatively thin layer of titanium or tantalum, may be used before depositing a bulk conductor, e.g., copper. In some embodiments, metallization layers are formed in inorganic dielectric material and over substrates of semiconductor materials, such as silicon. The use of such materials and techniques provides benefits relative to the materials and techniques typically used for the manufacture of, e.g., interposers and package substrates. Fine-pitch interconnects can be manufactured, e.g., at the die level, that do not require larger pitches, e.g., for soldering. Inorganic dielectric material allows for tightly (e.g., hermetically) sealed, multichip composite devices to be formed without the use of, e.g., organic mold compounds. For example, many packaging compounds have limitations related to, e.g., high temperatures and moisture resistance. A stack of metallization layers may be formed without these compounds, e.g., using inorganic dielectric material over and between metallization layers. In some embodiments, silicon dioxide or silicon nitride are used as insulators to form a stack of metallization layers.

Figure 6C:
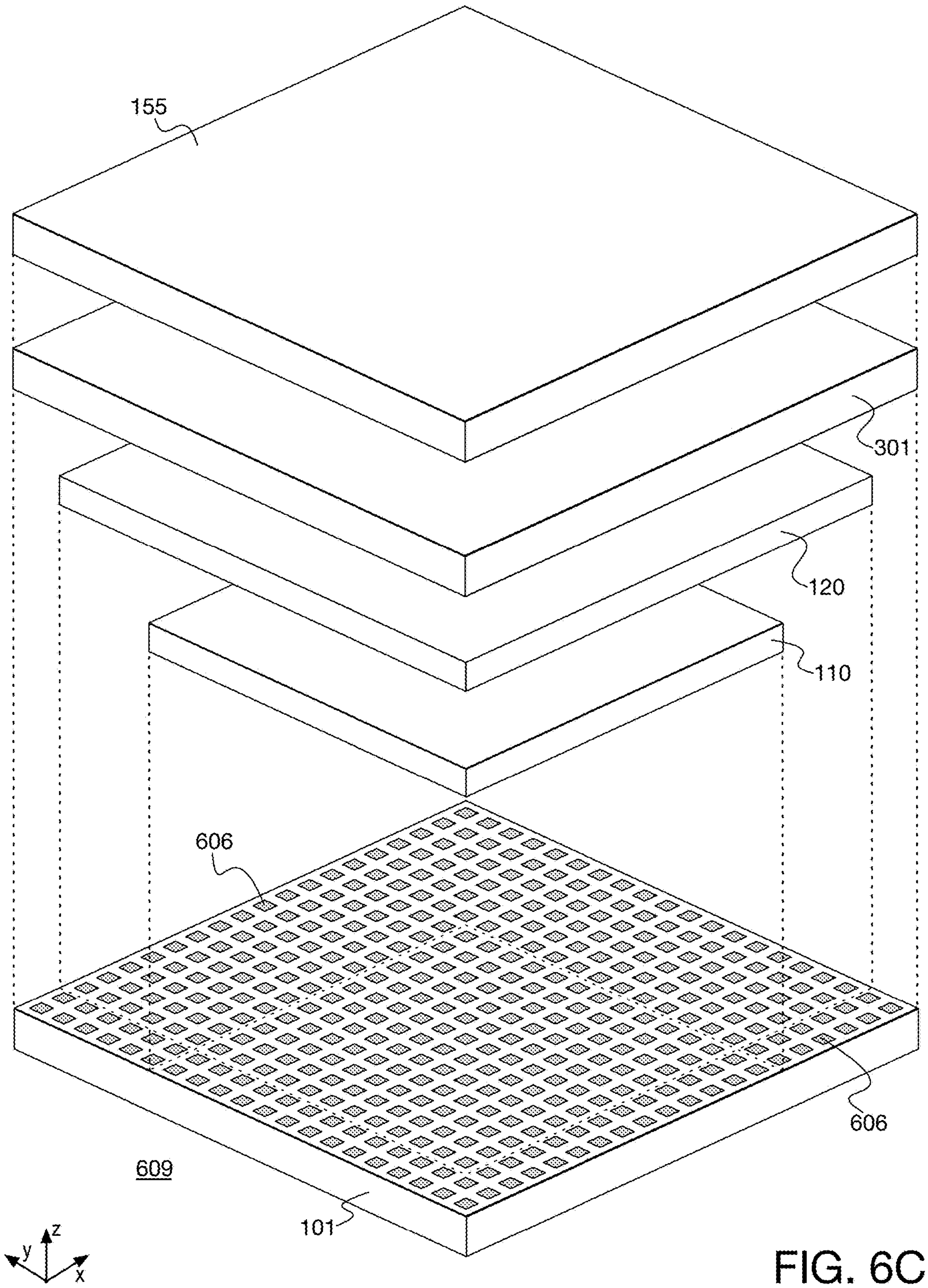

FIG. 6C shows an example of received first and second dies 110, 120 and lower and upper metallization layers 101, 301. In some embodiments, lower metallization layers 101 are coupled to substrate 609. In some embodiments, lower metallization layers 101 are formed or built up over substrate 609. In some embodiments, lower metallization layers 101 are received coupled to (or including) a substrate 609, which can be used as a handle die or carrier. For example, substrate 609 may be a wafer with multiple stacks of metallization layers 101 coupled or integrated with substrate 609, and multiple first dies 110, etc., may be received to manufacture multiple multichip devices. Metallization layers 101 may be coupled to substrate 609 by any suitable means. In some embodiments, metallization layers 101 are hybrid bonded to substrate 609. In other embodiments, metallization layers 101 are coupled to substrate 609 by adhesive materials. In some embodiments, metallization layers 101 are coupled to substrate 609 by release layers. In some embodiments, substrate 609 is connected to other similar substrates. In some embodiments, substrate 609 is part of a wafer that includes multiple other substrates.

Structural substrate 155 may also be received. In some embodiments, upper metallization layers 301 are received coupled, e.g., hybrid bonded, to structural substrate 155, which can be used as a handle die or carrier. Base interconnect interfaces 606 are on a top surface of lower metallization layers 101, and may be used for hybrid bonding first die 110 to lower metallization layers 101. Base interconnect interfaces 606 may be, e.g., bond pads. Base interconnect interfaces 606 may be similar to device-level interconnect interfaces 108 and may be any suitable structures. In some embodiments, lower metallization layers 101 are received without base interconnect interfaces 606. In some embodiments, bond pads are formed on lower metallization layers 101 after receipt.

First and second dies 110, 120 are within the area spanned by lower metallization layers 101. Dotted lines show the eventual positions (e.g., footprints) and relative alignments of first and second dies 110, 120 over lower metallization layers 101. Structural substrate 155 and upper metallization layers 301 span the entire area of the device and are vertically aligned with lower metallization layers 101.

Returning to FIG. 5, a composite device is formed in operation 520 when the first die is coupled to a group of metallization layers. The metallization layers and the first die are coupled together such that the first die is within an area of the metallization layers. For example, the metallization layers are at least as large laterally as the first die, and the first die is within the area spanned by the metallization layers. The coupling may be by any suitable means. In some embodiments, the first die is hybrid bonded to the uppermost layer in a stack of lower metallization layers. For example, metal bond pads on the first die may be hybrid bonded to metal bond pads, e.g., in a copper-copper bond, on an uppermost surface of the metallization layers. In some embodiments, metal bond pads are not added, but planarized surfaces on the first die and the metallization layers include terminations of existing metallization structures, e.g., the top (or bottom) of a via connection extending vertically from metal layers in a die or stack of metallization layers. Other structures may be used. In some embodiments, insulator or semiconductor materials in a die and metallization layers are hybrid bonded, e.g., in a silicon-silicon bond. Some dissimilar materials may be similarly hybrid bonded.

Coupling the first die and metallization layers may involve multiple operations. As an example, hybrid bonding may include, e.g., cleaning, polishing, planarizing, surface activation, and annealing. Hybrid bonding may include joining surfaces at elevated pressure and/or temperature, e.g., thermocompression. At least some of these operations may be performed before receiving the dies and metallization layers. Coupling between clean, activated, and substantially planar surfaces may be advantageous. Planarizing may include etching, grinding, and polishing (e.g., chemical mechanical polishing (CMP)). Some operations may perform multiple functions. For example, CMP may help clean and planarize surfaces, and some cleaning and surface-activation operations may overlap. Some operations, e.g., certain chemical cleans, may be more beneficial or may be altered for certain material or bond types, e.g., copper-copper or silicon-silicon bonds.

Various or multiple cleaning procedures may be used. Deionized water may be used, e.g., in a high-pressure water cleaning operation, before other chemical cleaning operations. In some embodiments, a plasma clearance operation is used before or after chemical cleaning operations. Multiple chemical solutions may be used to target particular contaminants. For example, a mixture of sulfuric acid and hydrogen peroxide may remove organic residues. In some embodiments, aqueous ammonia is mixed with hydrogen peroxide instead of sulfuric acid. In some embodiments, both mixtures are used sequentially. Other cleaning procedures use a first clean to remove particles and organic contaminants before a second clean removes metallic contaminants. The first clean may use a mixture of aqueous ammonia and aqueous hydrogen peroxide (in deionized water), and the second clean may use a mixture of aqueous hydrochloric acid and aqueous hydrogen peroxide. Some such embodiments employ a brief bath in a dilute solution of hydrofluoric acid between the first and second cleans. Advantageously, the substrate may be cleaned before an operation activating the substrate surface.

Surface activation may prepare die and metallization layer surfaces for bonding, e.g., direct bonding. Surface activation before bonding may improve bond strength or, if annealing to strengthen the bond, enable a reduced anneal temperature and length. Surface preparation increases the surface energy for bonding the surfaces, including bonding of their respective interconnect interfaces. Surface activation may be dry cleaning and can be used to remove, e.g., native oxides and adsorbed contaminants. Surface activation may be by, e.g., UV/ozone cleaning, fast-atom bombardment, or plasma treatments, etc. Plasma activation uses high-voltage and high-frequency stimulation of selected process gases to form a plasma and bombard the substrate surface, often with ions.

With sufficiently cleaned, activated, and planarized surfaces, bonding may begin as soon as the die and metallization layer surfaces are brought into contact, even at room temperature. After contact, even at room temperature, bond strength increases as more bonds form at the atomic level. Because the bonding begins immediately after contact, coupling operation 520 may include aligning the respective surfaces and structures, e.g., interconnect interfaces, before contact is made between the surfaces.

Bond strength may be improved by annealing. As with cleaning, annealing techniques may be influenced by embodiment parameters (e.g., the materials bonded, surface preparations used, etc.) in previous operations. Certain anneal operations may be paired with particular cleaning or activation operations. Annealing may be performed following other operations, and anneal temperatures may be limited by the material used in, or the structures formed on and within, the die and metallization layers. As such, the use of high-temperature capable inorganic dielectric material, e.g., instead of organic mold compounds, can be beneficial.

Inorganic dielectric material is formed over the composite device in operation 530. Inorganic dielectric material may be formed over the composite device multiple times, e.g., after coupling the metallization layers to the first die and after coupling the second die to the composite device. Inorganic dielectric material may be formed over inorganic dielectric material, e.g., when using multiple materials, such as in alternating layers. In some embodiments, a single inorganic dielectric material is deposited in successive applications, e.g., to form a sufficient thickness of inorganic dielectric material or with a satisfactory topography.

Inorganic dielectric material may be formed by any suitable means. Some inorganic dielectric materials are well-known and may be formed in well-controlled layers or at relatively high rates. In some embodiments, silicon dioxide is formed over the composite device by chemical vapor deposition (CVD). In some embodiments, silicon nitride is formed by low-pressure CVD (LPCVD). In some embodiments, silicon dioxide and silicon nitride are deposited in alternating layers, e.g., to control certain bulk characteristics for the composite dielectric material. Well-controlled oxide layers, e.g., of silicon dioxide, may be thermally grown. Wet (with $H_2O$) or dry oxidation ($O_2$) may be used. In some embodiments, plasma-enhanced CVD (PECVD) is used to form inorganic dielectric material layers of silicon dioxide. Other materials and methods may be used.

Operation 530 may include planarizing the inorganic dielectric material. For example, when forming inorganic dielectric material quickly or conformally, inorganic dielectric material may have an exposed surface that needs to be prepared, e.g., planarized, before further processing, e.g., bonding. Inorganic dielectric material may be removed by, e.g., grinding or CMP. In some embodiments, excess inorganic dielectric material is removed by plasma etching. In some embodiments, excess inorganic dielectric material is removed by wet etching. In some such embodiments, excess inorganic dielectric material is removed by a combination of laser exposure and wet etching.

Figure 6D:
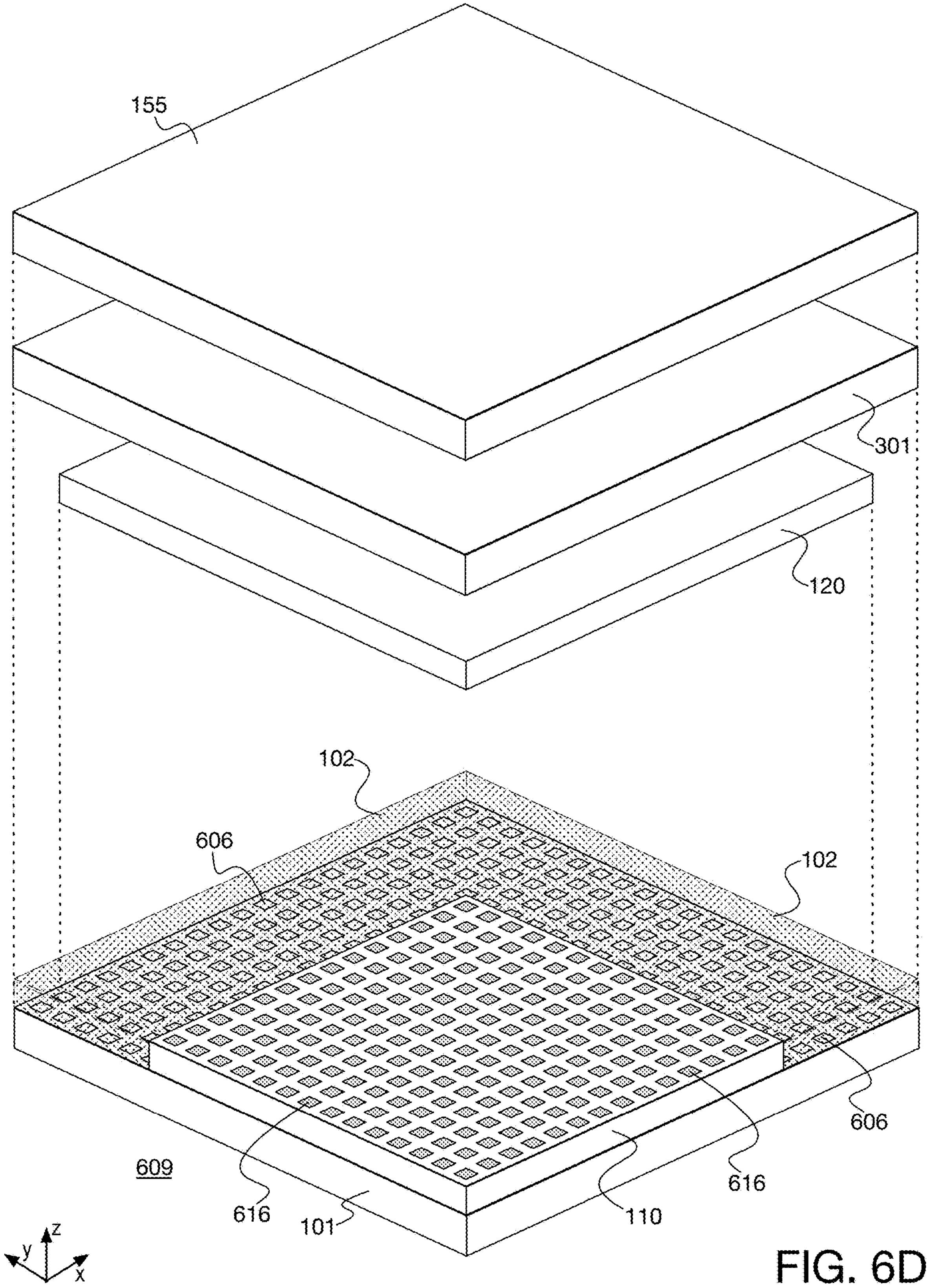

FIG. 6D shows the device after first die 110 has been coupled (e.g., hybrid bonded) to lower metallization layers 101. Inorganic dielectric material 102 has been deposited over the device and planarized to a substantially flat surface at a level with the top of first die 110.

First die 110 is shown with first-die interconnect interfaces 616, which may be similar to, e.g., base interconnect interfaces 606. In some embodiments, first-die interconnect interfaces 616 are bond pads. In some embodiments, first die 110 is received with first-die interconnect interfaces 616. In other embodiments, first-die interconnect interfaces 616 are formed on first die 110, e.g., over metallization structures, such as via connections.

Returning to FIG. 5, via structures are formed through the inorganic dielectric material in operation 540. Via structures may be substantially vertical metallization structures and may be formed by removing inorganic dielectric material and forming metal in the void formed by the removing. Via structures may be of any suitable shape. For example, vias in voids formed by masking and etching may have substantially rectangular cross sections. Vias in voids formed using laser exposure or other drilling or boring techniques may have substantially cylindrical shapes. Vias may have at least a slight taper with a wider width at a top or bottom. Via structures may be formed by conventional methods. For example, damascene, dual-damascene, and other metallization processes may be used. In some embodiments, reactive ion etching (RIE) or deep RIE (DRIE) is used to form voids in the inorganic dielectric material. In some embodiments, chemical or wet etches are used. In some embodiments, laser exposure is used before a wet etch to remove inorganic dielectric material. Metallization structures may be formed by conventional methods, e.g., by sputtering or electroplating. A cleaning operation may be beneficial before forming metallization structures. In some embodiments, an oxide clearance operation removes oxide from, e.g., a bond pad before depositing metal for a via on and over the bond pad.

Vias of various heights and depths may be formed. In some embodiments, vias are formed through inorganic dielectric material laterally adjacent to a first-level die and over a base stack of metallization layers. A second-level die can then be coupled to the base stack of metallization layers by coupling to the vias. In some embodiments, vias are formed through inorganic dielectric material at a second level and over a first-level die. An upper stack of metallization layers can then be coupled to a first-level die by coupling to the vias. In some embodiments, tall vias are formed through inorganic dielectric material laterally adjacent to first- and second-level dies and over a base stack of metallization layers. In some such embodiments, tall vias are formed through two levels concurrently. In some embodiments, tall vias are formed by joining two single-level vias that were formed through each level separately. In other embodiments, tall vias are formed by forming vias through inorganic dielectric material on a second level over vias through inorganic dielectric material on a first level. An upper stack of metallization layers can be coupled to the base stack of metallization layers by coupling to the vias.

Figure 6E:
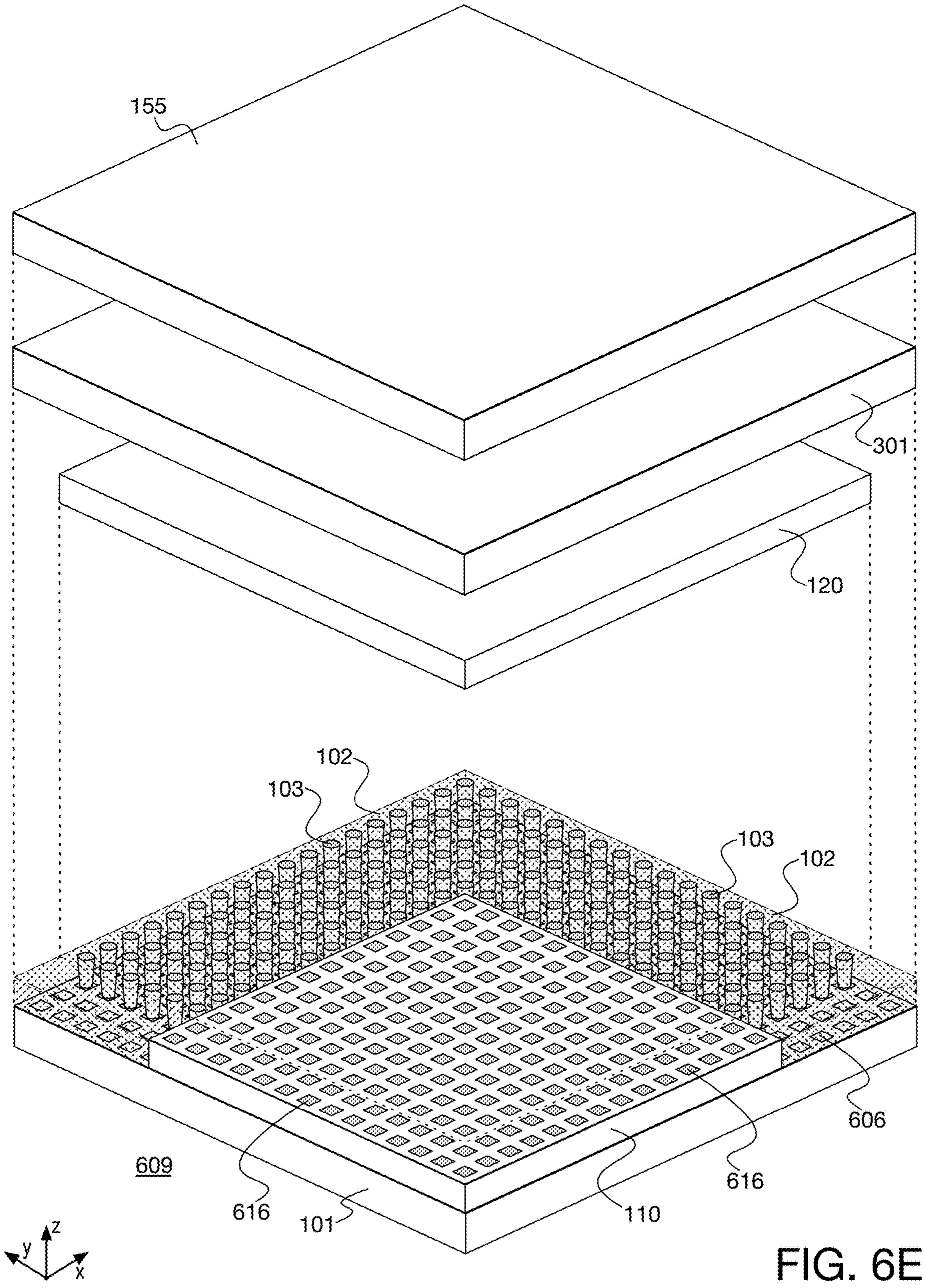

FIG. 6E shows the device after first-level TDVs 103 have been formed through inorganic dielectric material 102 down to lower metallization layers 101. A dotted line shows where second die 120 will be coupled to the device, overlapping a portion of first die 110 and over a portion of inorganic dielectric material 102, where it will be coupled to lower metallization layers 101 by first-level TDVs 103.

Returning to FIG. 5, the second die is coupled to the composite device in operation 550. Operation 550 may include hybrid bonding the second die to the device, which may share similarities with the coupling of operation 520. Coupling the second die to the device in operation 550 may include operations 552 and 554. In operation 552, the second die is hybrid bonded to the first die. In operation 554, the second die is hybrid bonded to one or more TDVs.

As before, the surfaces to be coupled will advantageously be clean, activated, and substantially planar surfaces. Accordingly, operation 550 may include some or all of cleaning, polishing, planarizing, and surface activation of one or both surfaces (e.g., of the first and second dies, or of the second die and inorganic dielectric material and tops of TDVs), as well as annealing to strengthen formed bonds. Such an anneal strengthens, e.g., copper-copper bonds between second-die interconnect interfaces and TDVs, by improving the metal grain structures, e.g., by diffusion across the bonded interface. Other, e.g., $SiO_2$—$SiO_2$, bonding, also benefits from diffusion, etc. caused by a high-temperature anneal. Such an anneal may benefit from, or be enabled by, the use of an inorganic dielectric material (e.g., instead of an organic dielectric incapable of sufficiently high anneal temperatures).

Figure 6F:
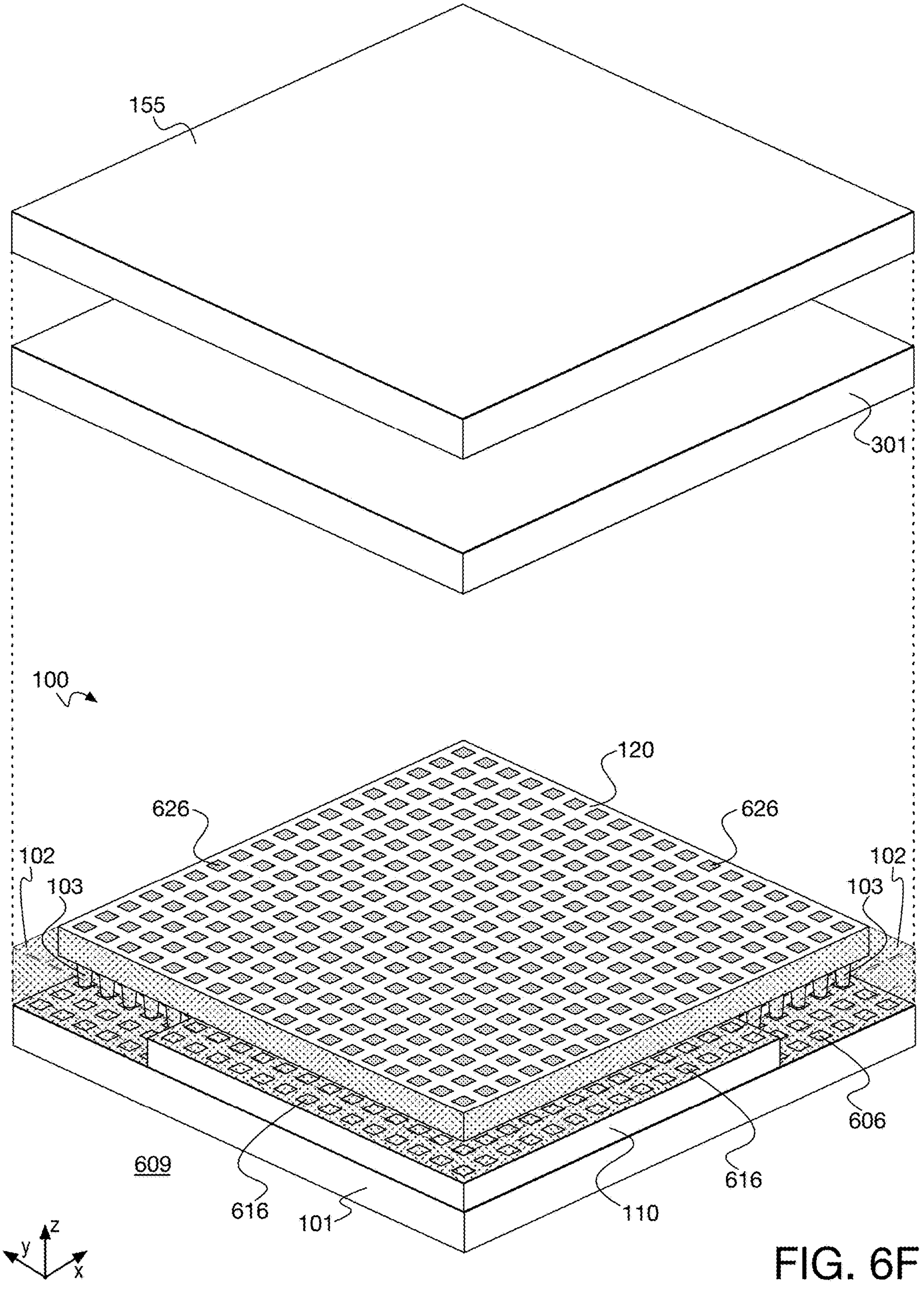

FIG. 6F shows multichip composite device 100 after second die 120 has been coupled (e.g., hybrid bonded) to first die 110, first-level TDVs 103, and inorganic dielectric material 102. Inorganic dielectric material 102 has again been deposited over the device and planarized to a substantially flat surface at a level with the top of second die 120. Inorganic dielectric material 102 at the second level may be the same or a different inorganic dielectric material 102 as at the first level.

Second die 120 is shown with second-die interconnect interfaces 626, which may be similar to, e.g., base interconnect interfaces 606 or first-die interconnect interfaces 616. In some embodiments, second-die interconnect interfaces 626 are bond pads. In some embodiments, second die 120 is received with second-die interconnect interfaces 626. In other embodiments, second-die interconnect interfaces 626 are formed on second die 120, e.g., over metallization structures, such as via connections.

Figure 6G:
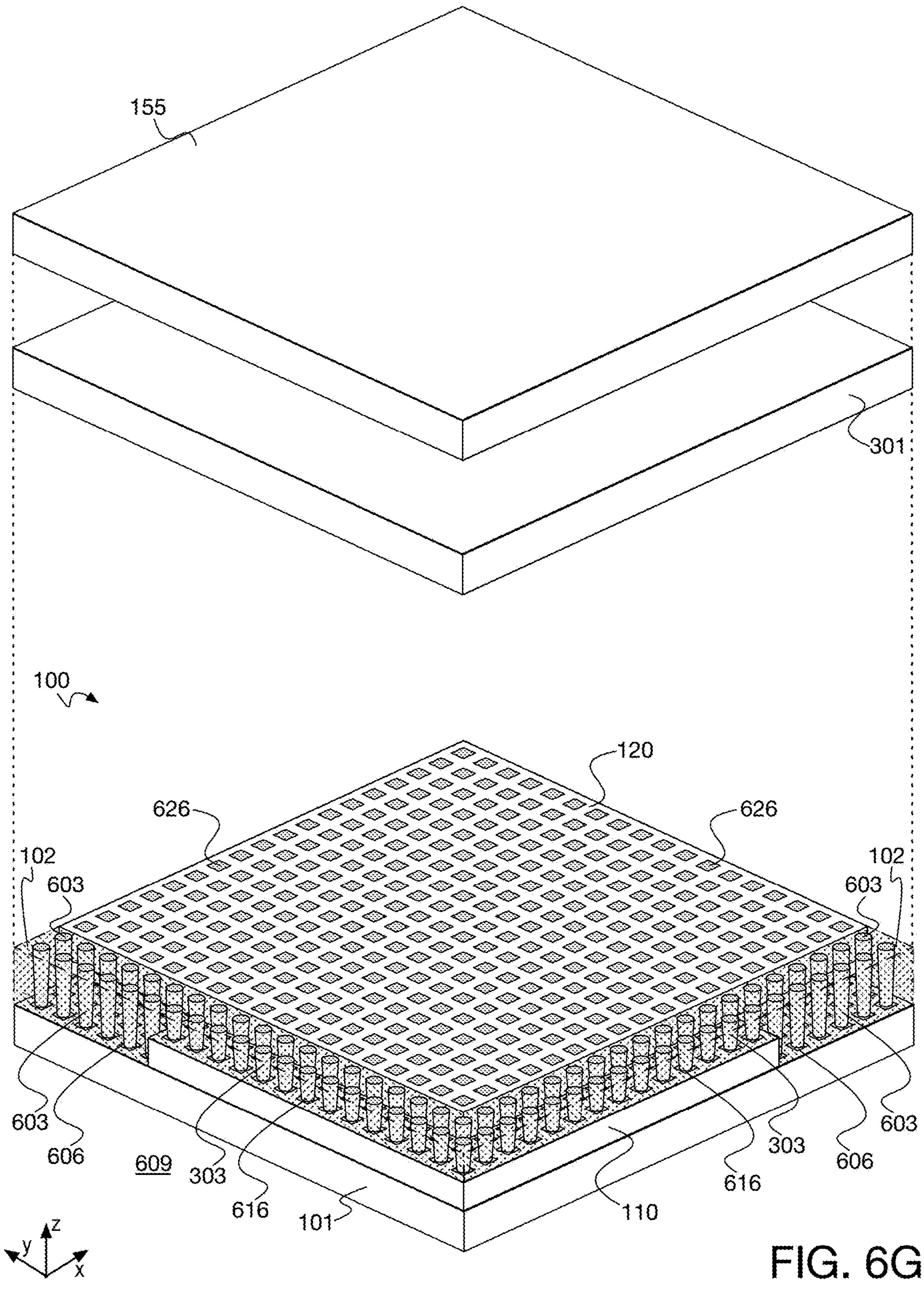

FIG. 6G shows multichip composite device 100 after more vias have been formed through inorganic dielectric material 102. Second-level TDVs 303 have been formed and extend through inorganic dielectric material 102 and contact first-die interconnect interfaces 616 on a top surface of first die 110. Tall TDVs 603 have been formed and extend through inorganic dielectric material 102 and contact base interconnect interfaces 606 on a top surface of lower metallization layers 101.

Returning to FIG. 5, a second group of metallization layers are coupled to the composite device in operation 560. The second group of metallization layers may be coupled to the composite device much as the first metallization layers and first die (or the composite device and the second die) were coupled. The second group of metallization layers may be coupled to the composite device by hybrid bonding the second group of metallization layers and, e.g., the second die, inorganic dielectric material, and vias.

In some embodiments, the second group of metallization layers may be coupled, e.g., hybrid bonded, to the second die before the second die is coupled to the composite device. For example, the second die may be hybrid bonded to the second group of metallization layers in the same manner as the first die may be hybrid bonded to the first group of metallization layers. Inorganic dielectric material could then be formed over the second group of metallization layers (and planarized), and vias could be formed through the inorganic dielectric material as if it were a first level of inorganic dielectric material. The first die (and inorganic dielectric material and vias) over the first group of metallization layers could then be coupled to the second die (and inorganic dielectric material and vias) over the second group of metallization layers. The second group of metallization layers can act as a handle die or carrier for the second die just as the first group of metallization layers can act as a handle die or carrier for the first die. In some such embodiments, tall (two-level) vias are formed by coupling two single-level vias.

Figure 6H:
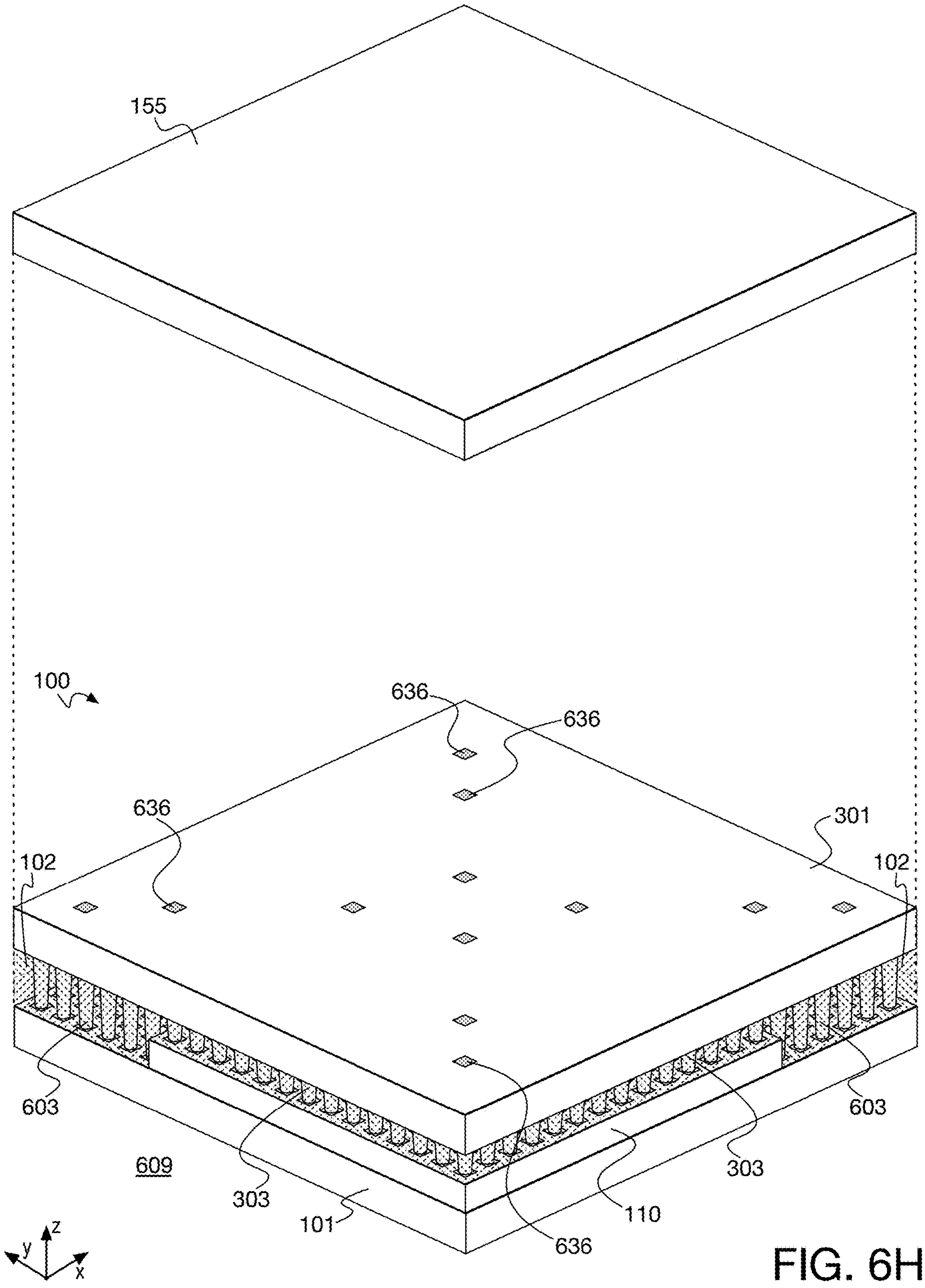

FIG. 6H shows multichip composite device 100 after upper metallization layers 301 have been coupled (e.g., hybrid bonded) to second die 120, second-level TDVs 303, tall TDVs 603, and inorganic dielectric material 102.

Upper metallization layers 301 are shown with upper interconnect interfaces 636, which may be used, e.g., to make electrical connections above multichip composite device 100 to, e.g., a power supply or second multichip composite device 100. Such electrical connections may be through structural substrate 155. Upper interconnect interfaces 636 may be similar to device-level interconnect interfaces 108 or base interconnect interfaces 606. Upper interconnect interfaces 636 may be any suitable structures. Upper interconnect interfaces 636 may be bond pads. In some embodiments, upper metallization layers 301 are received with upper interconnect interfaces 636. In other embodiments, upper interconnect interfaces 636 are formed on upper metallization layers 301, e.g., over metallization structures, such as via connections. In other embodiments, connections are made to metallization structures on a top surface of upper metallization layers 301, such as the uppermost of upper metallization layers 301 or the tops of via connections. In yet other embodiments, upper metallization layers 301 connect metallization structures only on its underside, e.g., metallization structures on a top surface of second die 120 (e.g., second-die interconnect interfaces 626) to other such metallization structures (e.g., on a top surface of second die 120 or second-level TDVs 303 or tall TDVs 603).

Returning to FIG. 5, a structural substrate is coupled to the composite device in operation 570. The structural substrate may be hybrid bonded to the composite device. In some embodiments, the structural substrate is coupled to one or more of the second die, a second group of metallization layers, or inorganic dielectric material. Coupling the structural substrate to the composite device may include substantial bonding of non-metal structures, e.g., of a bare substrate to inorganic dielectric material. For example, in some embodiments, the structural substrate is a crystalline material, such as a semiconductor material, without metallization structures, and the composite device has a layer of inorganic dielectric material as its top surface. In some embodiments, coupling the structural substrate to the composite device includes silicon-to-silicon dioxide hybrid bonding. In some embodiments, the structural substrate is bonded to the composite device with an intermediate bonding layer. In some such embodiments, the intermediate bonding layer includes silicon or silicon nitride. In some embodiments, the intermediate bonding layer includes copper. Other materials may be used. In some embodiments, metallization structures are formed in the structural substrate for coupling to matching structures on the bonding surface of the composite device. In some such embodiments, metallization structures are formed in the structural substrate prior to receipt.

Operation 570 may include operation 572. In operation 572, TSV are formed through the structural substrate. The vias may be formed by any suitable means. Voids in the substrate may be formed by, e.g., RIE or DRIE. In some embodiments, wet etches are used. Conventional metallization processes may be used, e.g., damascene and other deposition processes. In some embodiments, no vias are needed for connecting to the composite device on the side of the structural substrate. In some such embodiments, there is no second group of metallization layers. In other embodiments, there is a second group of metallization layers, but with no, e.g., electrical connections needed on the side of the second group of metallization layers. In some embodiments, device-level interconnect interfaces, e.g., bond pads are formed over the vias.

Figure 6I:
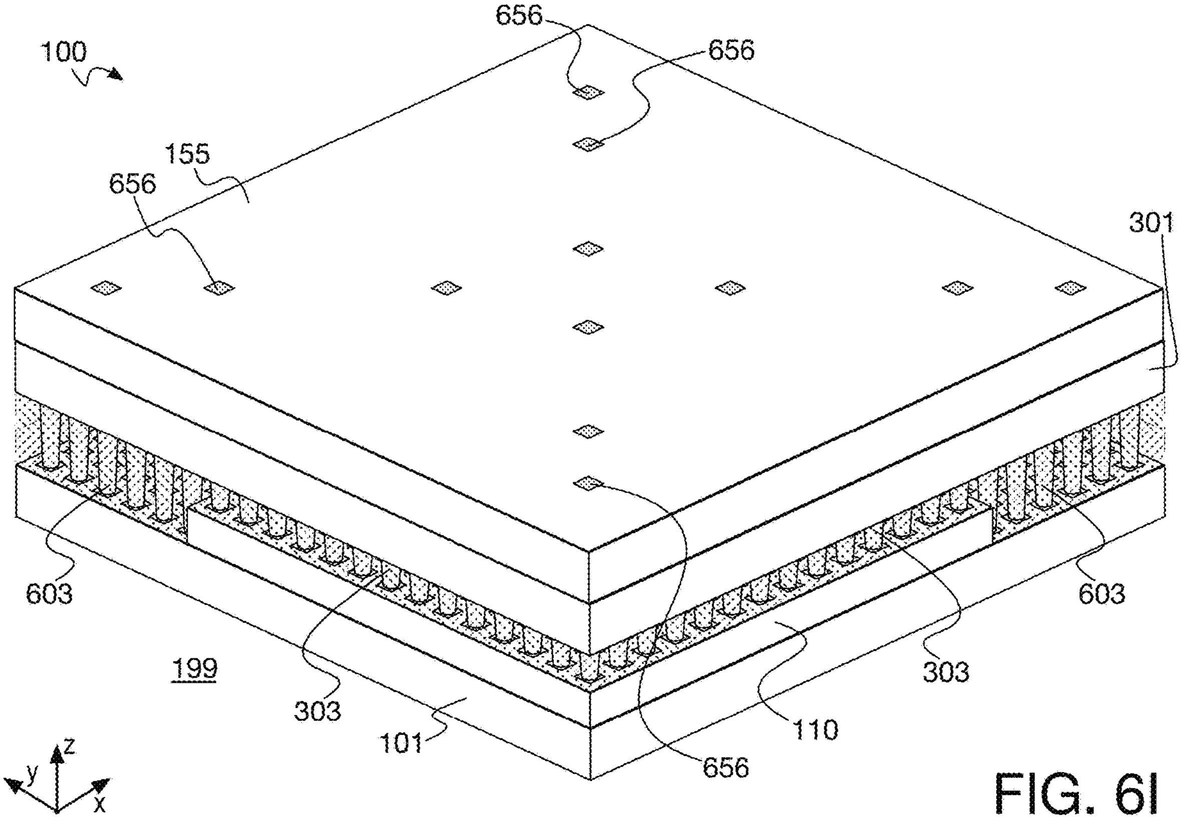

FIG. 6I shows multichip composite device 100 after structural substrate 155 has been coupled (e.g., hybrid bonded) to upper metallization layers 301. Structural substrate 155 is shown with structural substrate interconnect interfaces 656, which may be used, e.g., to make electrical connections above multichip composite device 100 to, e.g., a power supply or second multichip composite device 100. In some embodiments, structural substrate 155 is received with structural substrate interconnect interfaces 656, which may be, e.g., bond pads. In other embodiments, structural substrate interconnect interfaces 656 are formed on structural substrate 155, e.g., over metallization structures, such as TSV 403. In some embodiments, structural substrate 155 is coupled to system substrate 199. In some such embodiments, structural substrate 155 is coupled to a power supply through system substrate 199.

Returning to FIG. 5, interconnect interfaces are formed on a lower side of the composite device in operation 580. In some embodiments, device-level interconnect interfaces are formed in the lower or first group of metallization layers prior to receipt of the metallization layers. In some embodiments, interconnect interfaces are formed in the lower or first group of metallization layers by forming vias from exterior surface to, e.g., an uppermost (or lowermost) of the metallization layers. In some embodiments, interconnect interfaces are formed by exposing an uppermost (or lowermost) of the metallization layers. In some embodiments, forming interconnect interfaces includes forming bond pads over metallization structures in the lower or first group of metallization layers.

Figure 7A:
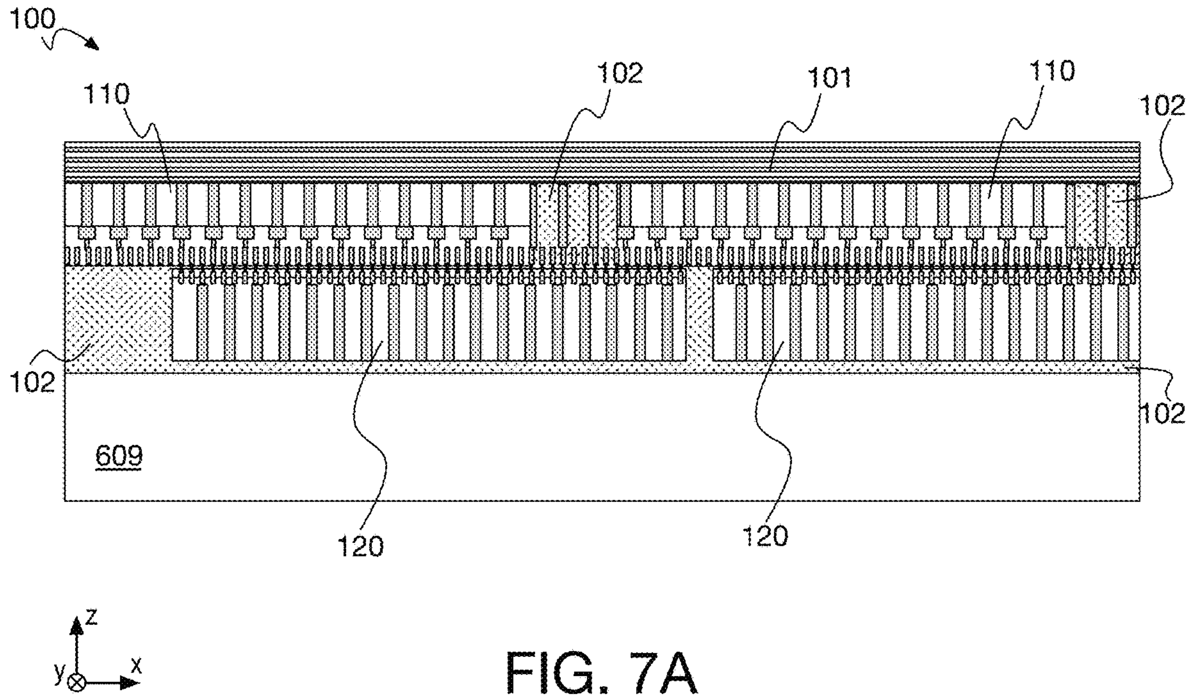
FIGS. 7A, 7B, 7C, and 7D illustrate cross-sectional profile views of a multichip composite device, including lower and upper metallization layers and first and second dies, at various stages of manufacture.
Figure 7B:
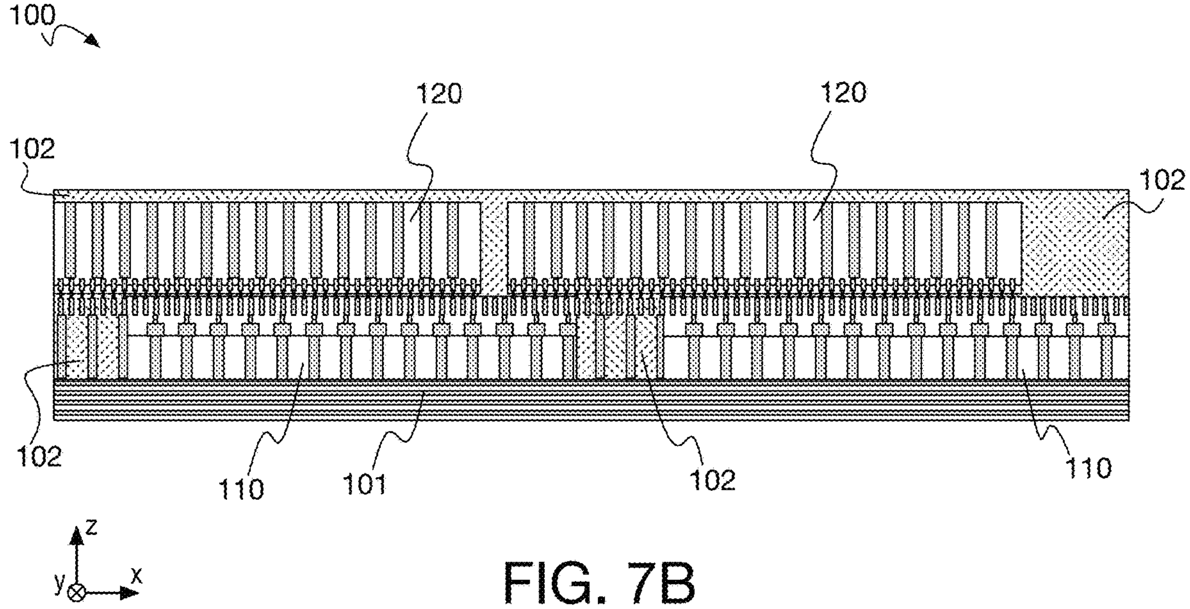
Figure 7C:
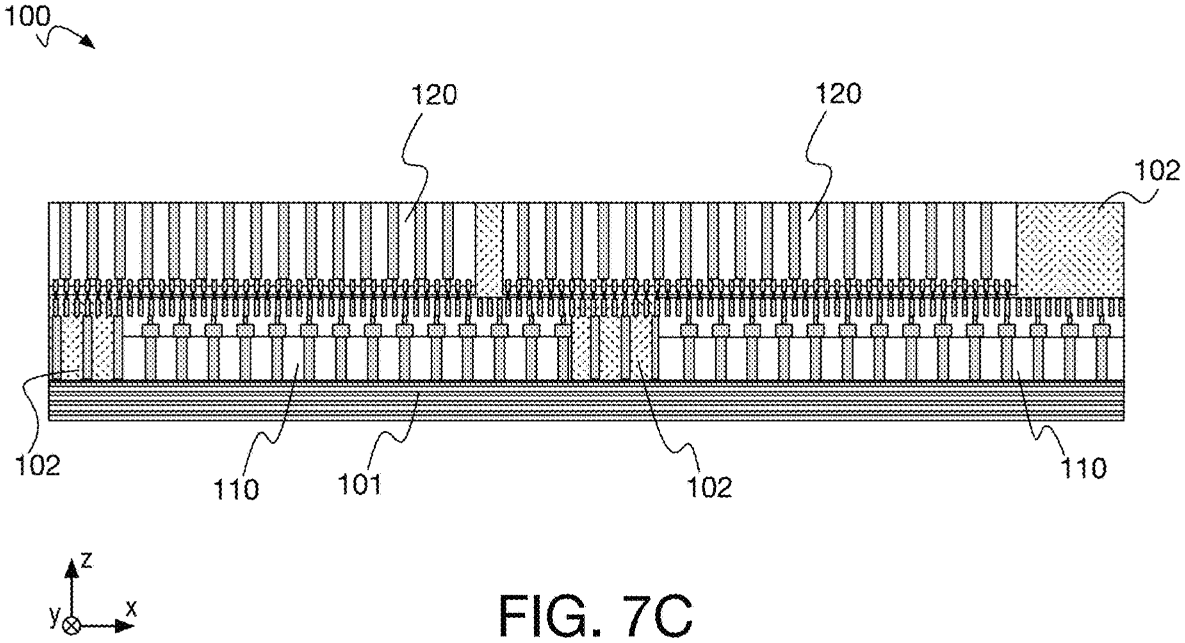
Figure 7D:
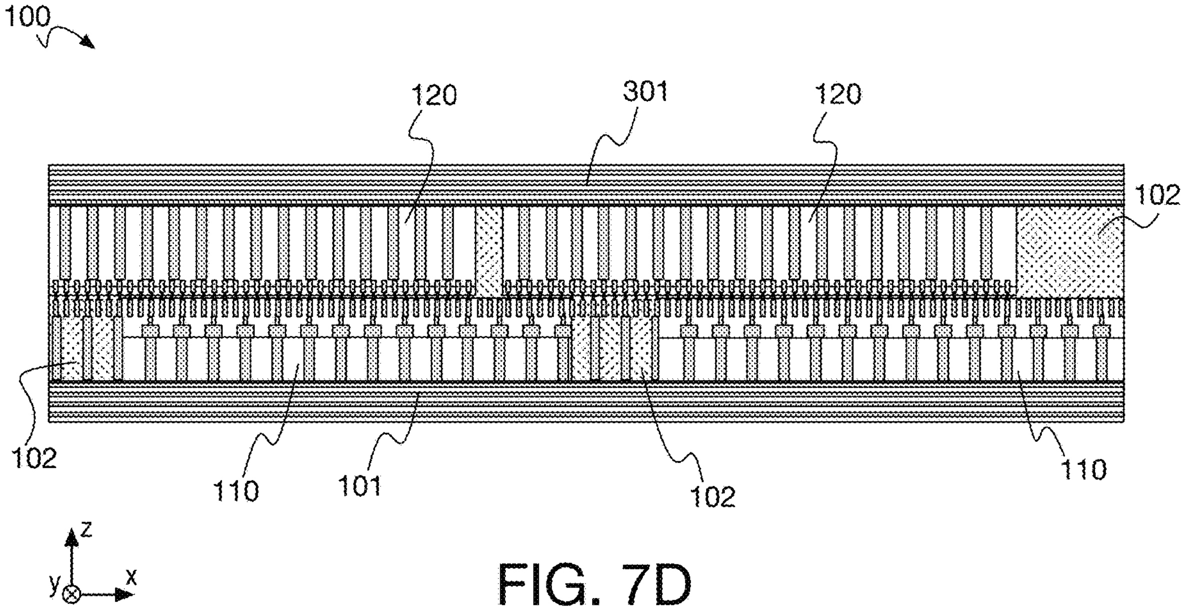

FIGS. 7A, 7B, 7C, and 7D illustrate cross-sectional profile views of multichip composite device 100, including lower and upper metallization layers 101, 301 and first and second dies 110, 120, at various stages of manufacture, in accordance with some embodiments. FIGS. 7A, 7B, 7C, and 7D illustrate a progression as multichip composite device 100 is processed to form upper metallization layers 301 over first and second dies 110, 120 already coupled to lower metallization layers 101. FIG. 7A shows a cross-sectional profile view of multichip composite device 100 coupled to substrate 609 with metallization layers 101 and multiple dies at multiple levels. FIG. 7B shows a cross-sectional profile view of multichip composite device 100 uncoupled from substrate 609. FIG. 7C shows a cross-sectional plan view of multichip composite device 100 with die surfaces revealed for coupling. FIG. 7D shows a cross-sectional plan view of multichip composite device 100 with upper metallization layers 301.

As shown in FIG. 7A, multichip composite device 100 is coupled to substrate 609 with lower metallization layers 101 up. Multiple first dies 110 are over multiple second dies 120. Inorganic dielectric material 102 is laterally adjacent first and second dies 110, 120. A layer of inorganic dielectric material 102 is also between second dies 120 and substrate 609. In some embodiments, substrate 609 is coupled to multichip composite device 100 and inorganic dielectric material 102 by release layers. First and second dies 110, 120 are formed, and multichip composite device 100 includes lower metallization layers 101, but no upper metallization layers 301 are coupled to second dies 120.

As shown in FIG. 7B, multichip composite device 100 is oriented with lower metallization layers 101 down and second dies 120 over first dies 110. Multichip composite device 100 is decoupled from substrate 609, and the layer of inorganic dielectric material 102 over second dies 120 is revealed. In some embodiments, release layers are used to decouple substrate 609 from multichip composite device 100.

As shown in FIG. 7C, inorganic dielectric material 102 on an upper surface of multichip composite device 100 is removed and planarized, and the upper surfaces of second dies 120 are exposed. Metallization structures on the upper surfaces of second dies 120 are available for coupling, and the planarized upper surface of multichip composite device 100 includes inorganic dielectric material 102 between second dies 120. The planarized inorganic dielectric material 102 is suitable as a substrate for further processing, e.g., for forming metallization layers over second dies 120 and multichip composite device 100.

As shown in FIG. 7D, multichip composite device 100 includes upper metallization layers 301 formed over, or coupled to, inorganic dielectric material 102 and second dies 120. In some embodiments, upper metallization layers 301 are formed over multichip composite device 100, e.g., built up by depositing inorganic dielectric material 102 and forming metallization structures through inorganic dielectric material 102. In some embodiments, the lowermost of upper metallization layers 301 are coupled to metallization structures on the upper surfaces of second dies 120. In some embodiments, metallization structures on the upper surfaces of second dies 120 and the lowermost of upper metallization layers 301 are hybrid bonded together. In some such embodiments, metallization structures on the upper surfaces of second dies 120 and the lowermost of upper metallization layers 301 are annealed together. The availability of the process of FIGS. 7A-7D provides further manufacturing flexibility.

Figure 8:
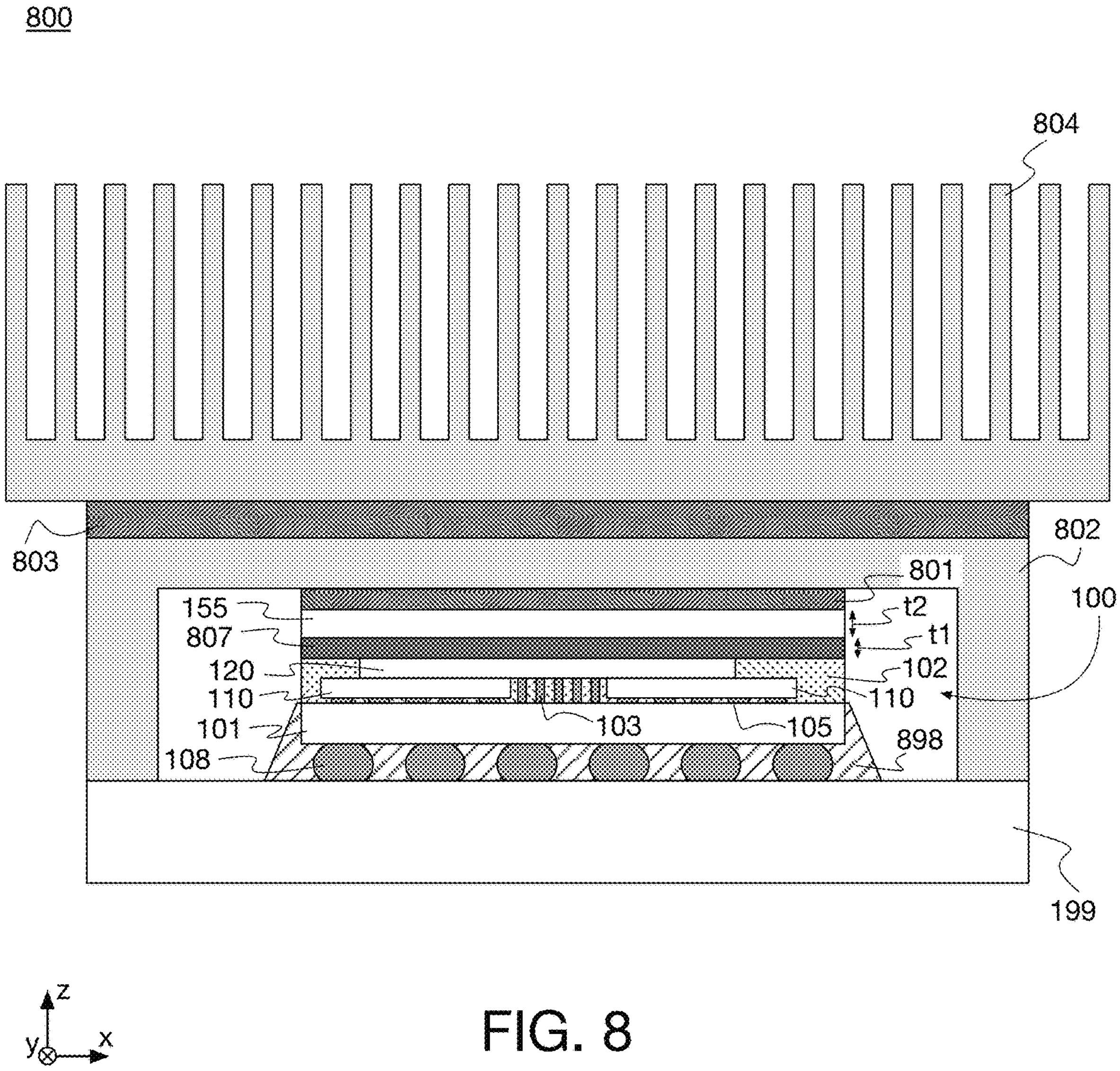
FIG. 8 illustrates an example microelectronic device assembly including a heat removal enhancement.

FIG. 8 illustrates an example microelectronic device assembly 800 including a heat removal enhancement, in accordance with some embodiments. In the illustrative example of FIG. 8, multichip composite device 100 is represented. However, any microelectronic or multichip composite device discussed herein may be deployed in microelectronic device assembly 800. As shown, microelectronic device assembly 800 includes metallization layers 101 attached to system substrate 199 via device-level interconnect interfaces 108 and optional underfill 898. First dies 110 are coupled to metallization layers 101 at interfaces 105, and second die 120 is coupled to metallization layers 101 by TDVs 103. Inorganic dielectric material 102 is provided adjacent first and second dies 110, 120. As discussed, multichip composite device 100 may also include upper metallization layers 301 over second die 120, and second-level TDVs 303 may couple first dies 110 to upper metallization layers 301. In the context of FIG. 8, multichip composite device 100 also includes structural substrate 155 and a heat removal layer 807; however other heat removal enhancement may be used. In some embodiments, heat removal layer 807 is also an intermediate bonding layer 257.

Notably, heat removal layer 807 is made of a material or materials having a greater thermal conductivity than structural substrate 155 and having a thickness t1 less than a thickness t2 of structural substrate 155. In some embodiments, structural substrate 155 has a thickness t2 in the range of 60 to 120 μm, and a thickness of multichip composite device 100 (including heat removal layer 807, from the bottom of metallization layers 101 to the top of structural substrate 155) is in the range of about 150 to 200 microns. Other structural substrate 155 thicknesses may be used, such as thicknesses t2 in the range of 80 to 100 μm, or a thickness t2 of not less than 50 μm. Notably, depending on the mechanical properties required, structural substrate 155 thickness t2, the modulus of structural substrate 155, and other properties may be adjusted to meet the needs of the application of multichip composite device 100 and microelectronic device assembly 800. Such needs differ depending on the sizes of the dies or the package, and other characteristics of the application.

Heat removal layer 807 is a relatively thin layer coupled to, or formed on, structural substrate 155. A relatively thin layer may be deployed because of the high thermal conductivity of heat removal layer 807. In some embodiments, heat removal layer 807 has a thickness t1 in the range of 0.5 to 20 μm. In some embodiments, heat removal layer 807 has a thickness t1 of not more than 20 μm, not more than 10 μm, or not more than 5 μm. Heat removal layer 807 may include any material or materials having a greater thermal conductivity than that of structural substrate 155. In some embodiments, the material or composite of materials of heat removal layer 807 has a thermal conductivity of not less than twice the thermal conductivity of structural substrate 155. In some embodiments, the material or composite of materials of heat removal layer 807 has a thermal conductivity of not less than five times the thermal conductivity of structural substrate 155. In some embodiments, the material or composite of materials of heat removal layer 807 has a thermal conductivity of not less than seven times the thermal conductivity of structural substrate 155.

As discussed, in some embodiments, structural substrate 155 is crystalline silicon, which has a thermal conductivity of about 140 W/m-K. Heat removal layer 807, due to its high thermal conductivity, spreads heat from first and second dies 110, 120 more effectively than, for example, a silicon die. In some embodiments, heat removal layer 807 is or includes crystalline or polycrystalline diamond. In some embodiments, heat removal layer 807 is or includes crystalline or polycrystalline diamond having a thermal conductivity of not less than 400 W/m-K. In some embodiments, heat removal layer 807 is or includes crystalline or polycrystalline diamond having a thermal conductivity of not less than 1,000 W/m-K. In some embodiments, heat removal layer 807 is or includes copper. In some embodiments, heat removal layer 807 is or includes copper having a thermal conductivity of not less than 300 W/m-K. In some embodiments, heat removal layer 807 is or includes boron and nitrogen (e.g., a compound including boron and nitrogen, boron nitride). In some embodiments, heat removal layer 807 is or includes boron and nitrogen having a thermal conductivity of not less than 250 W/m-K. In some embodiments, heat removal layer 807 is or includes boron and arsenic (e.g., a compound including boron and arsenic, boron arsenide). In some embodiments, heat removal layer 807 is or includes boron and arsenic having a thermal conductivity of not less than 300 W/m-K. In some embodiments, heat removal layer 807 is or includes silicon and carbon (e.g., a compound including silicon and carbon, silicon carbide). In some embodiments, heat removal layer 807 is or includes silicon and carbon having a thermal conductivity of not less than 300 W/m-K. In some embodiments, heat removal layer 807 is or includes aluminum and nitrogen (e.g., a compound including aluminum and nitrogen, aluminum nitride). In some embodiments, heat removal layer 807 is or includes aluminum and nitrogen having a thermal conductivity of not less than 250 W/m-K. In some embodiments, heat removal layer 807 includes a combination of two or more of such materials. Other high thermal conductivity material layers may be used.

Microelectronic device assembly 800 further includes a thermal interface material (TIM) 801 disposed on a top surface of structural substrate 155. TIM 801 may include any suitable thermal interface material and may be characterized as TIM 1. Integrated heat spreader 802 having a surface on TIM 801 extends over multichip composite device 100, and is mounted to substrate 899 or to a motherboard (not shown) on which substrate 899 is mounted.

Microelectronic device assembly 800 further includes TIM 803 disposed on a top surface of integrated heat spreader 802. TIM 803 may include any suitable thermal interface material and may be characterized as TIM 2. TIM 801 and TIM 803 may be the same materials or they may be different. Heat sink 804 (e.g., an exemplary heat dissipation device or thermal solution) is on TIM 803 and dissipates heat generated by first and second dies 110, 120. Although illustrated with respect to microelectronic device assembly 800, the heat removal enhancement discussed herein may be deployed in any suitable architecture and form factor. For example, microelectronic device assembly 800 may be used in desktop and server form factors. In other contexts, a heat solution such as a heat pipe or heat spreader may be mounted directly on TIM 801. Such assemblies may be used in smaller form factor devices. Other heat dissipation devices may be used in concert with the heat removal enhancement structures discussed herein.

Figure 9:
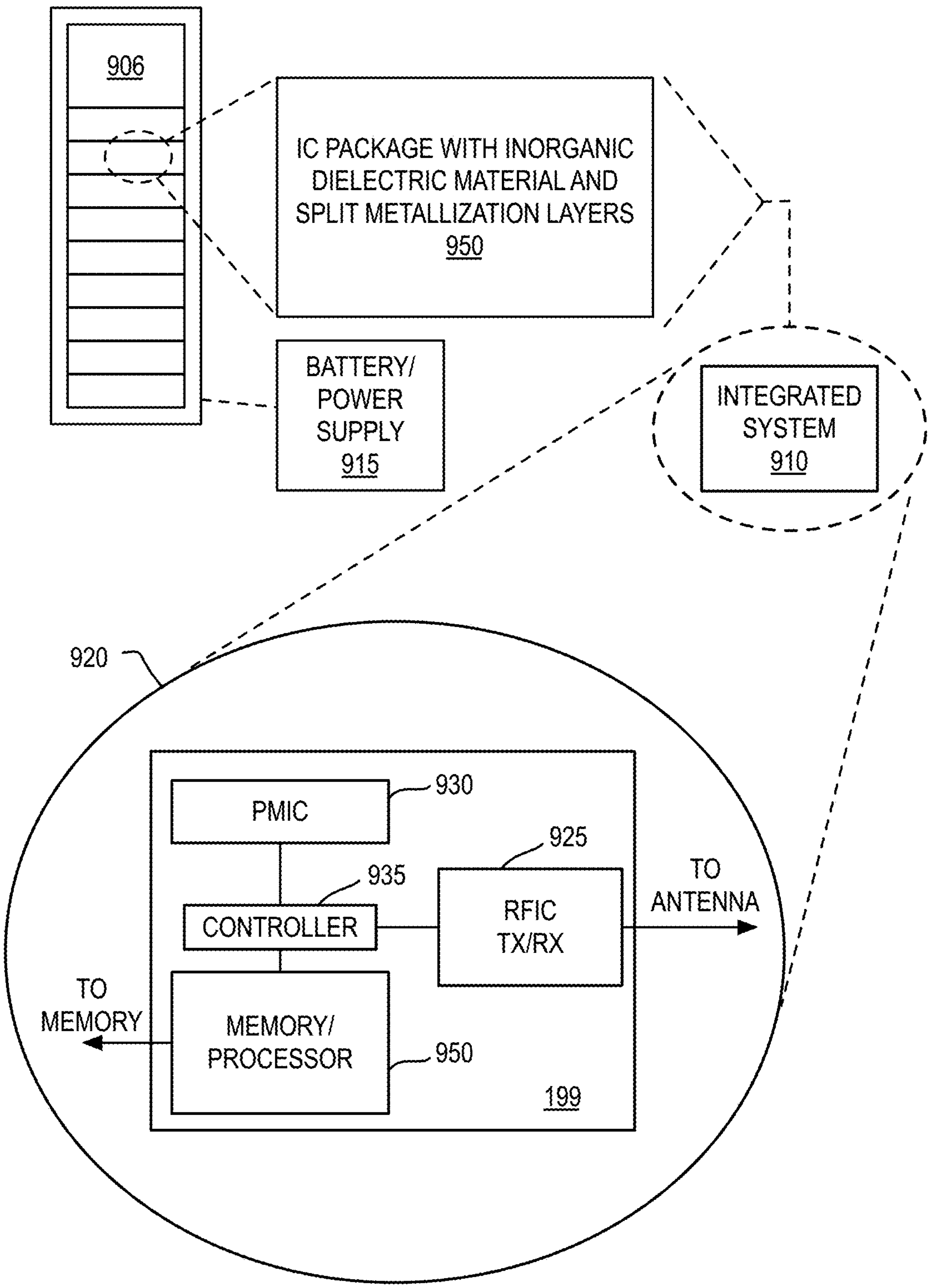
FIG. 9 illustrates a diagram of an example data server machine employing an integrated circuit die with inorganic dielectric material and split metallization layers.

FIG. 9 illustrates a diagram of an example data server machine 906 employing an IC die with inorganic dielectric material and split metallization layers, in accordance with some embodiments. Server machine 906 may be any commercial server, for example, including any number of high-performance computing platforms disposed within a rack and networked together for electronic data processing, which in the exemplary embodiment includes one or more devices 950 having inorganic dielectric material and split metallization layers.

Also as shown, server machine 906 includes a battery and/or power supply 915 to provide power to devices 950, and to provide, in some embodiments, power delivery functions such as power regulation. Devices 950 may be deployed as part of a package-level integrated system 910. Integrated system 910 is further illustrated in the expanded view 920. In the exemplary embodiment, devices 950 (labeled “Memory/Processor”) includes at least one memory chip (e.g., RAM), and/or at least one processor chip (e.g., a microprocessor, a multi-core microprocessor, or graphics processor, or the like) having the characteristics discussed herein. In an embodiment, device 950 is a microprocessor including an SRAM cache memory. As shown, device 950 may be a multichip composite system employing one or more IC dies with inorganic dielectric material and split metallization layers, as discussed herein. Device 950 may be further coupled to (e.g., communicatively coupled to) a board, an interposer, or system substrate 199 along with, one or more of a power management IC (PMIC) 930, RF (wireless) IC (RFIC) 925, including a wideband RF (wireless) transmitter and/or receiver (TX/RX) (e.g., including a digital baseband and an analog front end module further comprises a power amplifier on a transmit path and a low noise amplifier on a receive path), and a controller 935 thereof. In some embodiments, RFIC 925, PMIC 930, controller 935, and device 950 include IC dies having inorganic dielectric material and split metallization layers on system substrate 199 in a multichip composite system.

Figure 10:
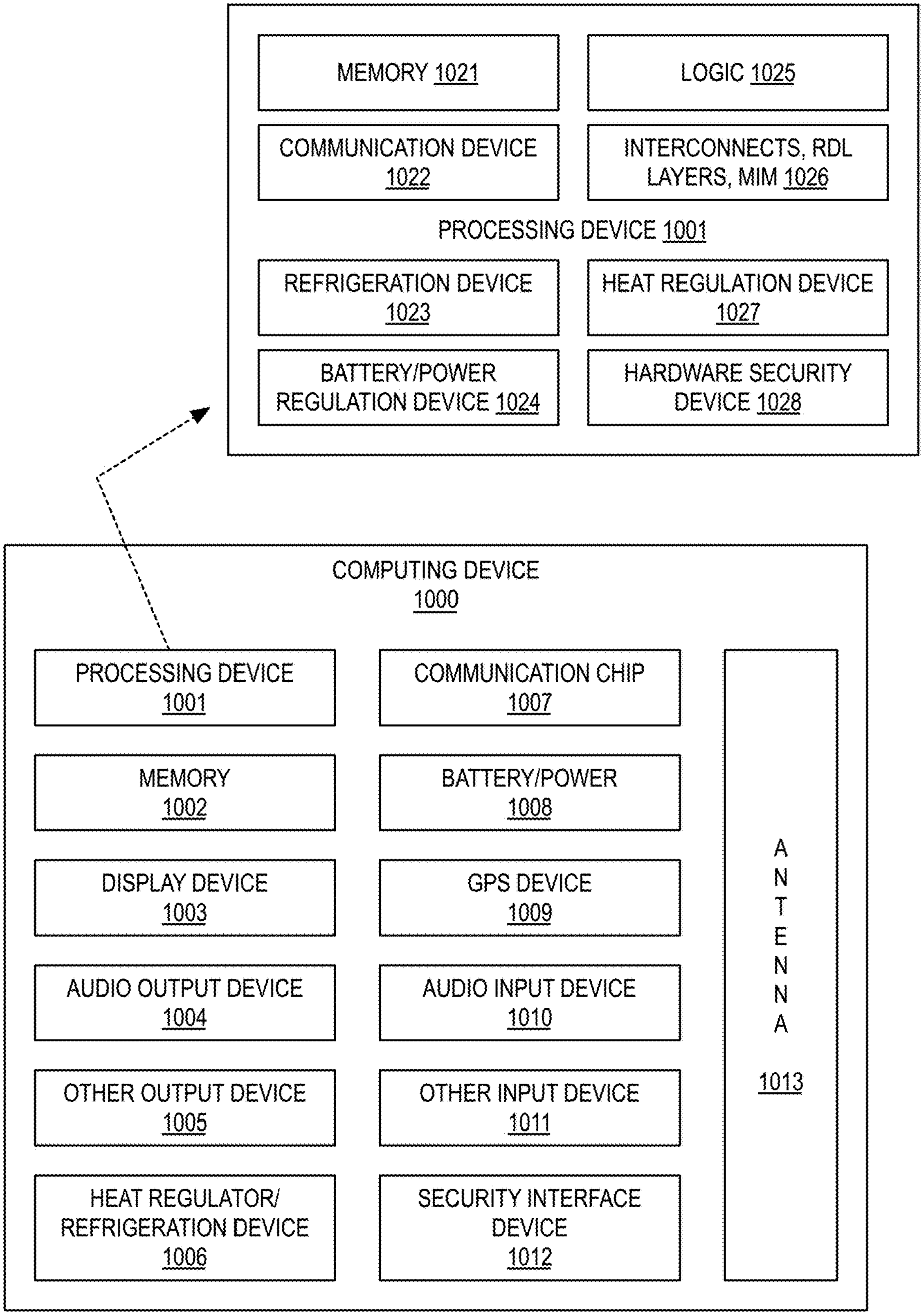
FIG. 10 is a block diagram of an example computing device, all in accordance with some embodiments.

FIG. 10 is a block diagram of an example computing device 1000, in accordance with some embodiments. For example, one or more components of computing device 1000 may include any of the devices or structures discussed herein. A number of components are illustrated in FIG. 10 as being included in computing device 1000, but any one or more of these components may be omitted or duplicated, as suitable for the application. In some embodiments, some or all of the components included in computing device 1000 may be attached to one or more printed circuit boards (e.g., a motherboard). In some embodiments, various ones of these components may be fabricated onto a single system-on-a-chip (SoC) die. Additionally, in various embodiments, computing device 1000 may not include one or more of the components illustrated in FIG. 10, but computing device 1000 may include interface circuitry for coupling to the one or more components. For example, computing device 1000 may not include a display device 1003, but may include display device interface circuitry (e.g., a connector and driver circuitry) to which display device 1003 may be coupled. In another set of examples, computing device 1000 may not include an audio output device 1004, other output device 1005, global positioning system (GPS) device 1009, audio input device 1010, or other input device 1011, but may include audio output device interface circuitry, other output device interface circuitry, GPS device interface circuitry, audio input device interface circuitry, audio input device interface circuitry, to which audio output device 1004, other output device 1005, GPS device 1009, audio input device 1010, or other input device 1011 may be coupled.

Computing device 1000 may include a processing device 1001 (e.g., one or more processing devices). As used herein, the term “processing device” or “processor” indicates a device that processes electronic data from registers and/or memory to transform that electronic data into other electronic data that may be stored in registers and/or memory (e.g., SRAM). Processing device 1001 may include a memory 1021, a communication device 1022, a refrigeration device 1023, a battery/power regulation device 1024, logic 1025, interconnects 1026 (i.e., optionally including redistribution layers (RDL) or metal-insulator-metal (MIM) devices), a heat regulation device 1027, and a hardware security device 1028.

Processing device 1001 may include one or more digital signal processors (DSPs), application-specific ICs (ASICs), central processing units (CPUs), graphics processing units (GPUs), cryptoprocessors (specialized processors that execute cryptographic algorithms within hardware), server processors, or any other suitable processing devices.

Computing device 1000 may include a memory 1002, which may itself include one or more memory devices such as volatile memory (e.g., dynamic random-access memory (DRAM)), nonvolatile memory (e.g., read-only memory (ROM)), flash memory, solid state memory, and/or a hard drive. In some embodiments, memory 1002 includes memory that shares a die with processing device 1001. This memory may be used as cache memory and may include embedded dynamic random-access memory (eDRAM) or spin transfer torque magnetic random-access memory (STT-M RAM).

Computing device 1000 may include a heat regulation/refrigeration device 1006. Heat regulation/refrigeration device 1006 may maintain processing device 1001 (and/or other components of computing device 1000) at a predetermined low temperature during operation.

In some embodiments, computing device 1000 may include a communication chip 1007 (e.g., one or more communication chips). For example, the communication chip 1007 may be configured for managing wireless communications for the transfer of data to and from computing device 1000. The term “wireless” and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

Communication chip 1007 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultramobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. Communication chip 1007 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. Communication chip 1007 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). Communication chip 1007 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. Communication chip 1007 may operate in accordance with other wireless protocols in other embodiments. Computing device 1000 may include an antenna 1013 to facilitate wireless communications and/or to receive other wireless communications (such as AM or FM radio transmissions).

In some embodiments, communication chip 1007 may manage wired communications, such as electrical, optical, or any other suitable communication protocols (e.g., the Ethernet). As noted above, communication chip 1007 may include multiple communication chips. For instance, a first communication chip 1007 may be dedicated to shorter-range wireless communications such as Wi-Fi or Bluetooth, and a second communication chip 1007 may be dedicated to longer-range wireless communications such as GPS, EDGE, GPRS, CDMA, WiMAX, LTE, EV-DO, or others. In some embodiments, a first communication chip 1007 may be dedicated to wireless communications, and a second communication chip 1007 may be dedicated to wired communications.

Computing device 1000 may include battery/power circuitry 1008. Battery/power circuitry 1008 may include one or more energy storage devices (e.g., batteries or capacitors) and/or circuitry for coupling components of computing device 1000 to an energy source separate from computing device 1000 (e.g., AC line power).

Computing device 1000 may include a display device 1003 (or corresponding interface circuitry, as discussed above). Display device 1003 may include any visual indicators, such as a heads-up display, a computer monitor, a projector, a touchscreen display, a liquid crystal display (LCD), a light-emitting diode display, or a flat panel display, for example.

Computing device 1000 may include an audio output device 1004 (or corresponding interface circuitry, as discussed above). Audio output device 1004 may include any device that generates an audible indicator, such as speakers, headsets, or earbuds, for example.

Computing device 1000 may include an audio input device 1010 (or corresponding interface circuitry, as discussed above). Audio input device 1010 may include any device that generates a signal representative of a sound, such as microphones, microphone arrays, or digital instruments (e.g., instruments having a musical instrument digital interface (MIDI) output).

Computing device 1000 may include a GPS device 1009 (or corresponding interface circuitry, as discussed above). GPS device 1009 may be in communication with a satellite-based system and may receive a location of computing device 1000, as known in the art.

Computing device 1000 may include other output device 1005 (or corresponding interface circuitry, as discussed above). Examples of the other output device 1005 may include an audio codec, a video codec, a printer, a wired or wireless transmitter for providing information to other devices, or an additional storage device.

Computing device 1000 may include other input device 1011 (or corresponding interface circuitry, as discussed above). Examples of the other input device 1011 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

Computing device 1000 may include a security interface device 1012. Security interface device 1012 may include any device that provides security measures for computing device 1000 such as intrusion detection, biometric validation, security encode or decode, access list management, malware detection, or spyware detection.

Computing device 1000, or a subset of its components, may have any appropriate form factor, such as a hand-held or mobile computing device (e.g., a cell phone, a smart phone, a mobile internet device, a music player, a tablet computer, a laptop computer, a netbook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device.

The subject matter of the present description is not necessarily limited to specific applications illustrated in FIGS. 1-10. The subject matter may be applied to other deposition applications, as well as any appropriate manufacturing application, as will be understood to those skilled in the art.

The following examples pertain to further embodiments, and specifics in the examples may be used anywhere in one or more embodiments.

In one or more first embodiments, a multichip composite device includes a plurality of intradevice metallization layers spanning an area of the device, a first die coupled to an uppermost one of the intradevice metallization layers, wherein the first die is fully within the area of the device, an inorganic dielectric material laterally adjacent the first die and over a portion of the intradevice metallization layers, a second die hybrid bonded to the first die, wherein the second die is over a portion of the first die and over a portion of the inorganic dielectric material, and one or more first vias extending through the inorganic dielectric material within the area of the device, and coupling the second die to the intradevice metallization layers.

In one or more second embodiments, further to the first embodiments, individual ones of the intradevice metallization layers have a thickness of at least 1 μm.

In one or more third embodiments, further to the first or second embodiments, the first die includes a plurality of intradie metallization layers, and a thickest one of the intradie metallization layers has a thickness less than that of a thinnest one of the intradevice metallization layers.

In one or more fourth embodiments, further to the first through third embodiments, a structural substrate is over the second die, and the inorganic dielectric material is between the structural substrate and the first die.

In one or more fifth embodiments, further to the first through fourth embodiments, the structural substrate includes a crystalline material of silicon and carbon, aluminum and oxygen, a III-V material, or predominantly silicon.

In one or more sixth embodiments, further to the first through fifth embodiments, the plurality of intradevice metallization layers is a plurality of first intradevice metallization layers, a plurality of second intradevice metallization layers is over the second die, the second die is hybrid bonded to a lowermost one of the second intradevice metallization layers, the second die is fully within an area of the second intradevice metallization layers, and the plurality of second intradevice metallization layers is coupled to the first die by one or more second vias extending through the inorganic dielectric material within the area of the device.

In one or more seventh embodiments, further to the first through sixth embodiments, a plurality of upper interconnect interfaces is over the plurality of second intradevice metallization layers.

In one or more eighth embodiments, further to the first through seventh embodiments, the plurality of intradevice metallization layers includes a plurality of lower interconnect interfaces on a side opposite the first die.

In one or more ninth embodiments, further to the first through eighth embodiments, a third die is coupled to and over the plurality of intradevice metallization layers and laterally adjacent the inorganic dielectric material.

In one or more tenth embodiments, further to the first through ninth embodiments, a fourth die is hybrid bonded to the third die, wherein the fourth die is over a portion of the third die.

In one or more eleventh embodiments, further to the first through tenth embodiments, the second die or the fourth die is hybrid bonded to both the first die and the third die.

In one or more twelfth embodiments, a multichip system includes a plurality of intradevice metallization layers coupled to a substrate, wherein one of the plurality of intradevice metallization layers is coupled to a power supply through the substrate, an inorganic dielectric material over the intradevice metallization layers, a first die adjacent the inorganic dielectric material and coupled to the plurality of intradevice metallization layers, wherein the first die is within an area of the intradevice metallization layers, and a second die hybrid bonded to the first die and coupled to the intradevice metallization layers by one or more first vias extending through the inorganic dielectric material within the area of the intradevice metallization layers.

In one or more thirteenth embodiments, further to the twelfth embodiments, individual ones of the intradevice metallization layers have a thickness of at least 1 μm.

In one or more fourteenth embodiments, further to the twelfth or thirteenth embodiments, the first die includes a plurality of intradie metallization layers, and a thickest one of the intradie metallization layers has a thickness less than a thinnest one of the intradevice metallization layers.

In one or more fifteenth embodiments, further to the twelfth through fourteenth embodiments, a structural substrate is over the second die, wherein the structural substrate spans the area of the intradevice metallization layers, and the inorganic dielectric material is between the structural substrate and the first die.

In one or more sixteenth embodiments, further to the twelfth through fifteenth embodiments, the plurality of intradevice metallization layers is a plurality of first intradevice metallization layers, a plurality of second intradevice metallization layers is hybrid bonded to, and over, the second die, and the second die is fully within an area of the second intradevice metallization layers.

In one or more seventeenth embodiments, further to the twelfth through sixteenth embodiments, a plurality of upper interconnect interfaces and a structural substrate are over the plurality of second intradevice metallization layers, wherein the structural substrate spans the area of the second intradevice metallization layers, and the second intradevice metallization layers are coupled to the upper interconnect interfaces by one or more upper vias extending through the structural substrate.

In one or more eighteenth embodiments, a method includes receiving a plurality of metallization layers, a first die, and a second die, forming a composite device by coupling the first die to the plurality of metallization layers, wherein the first die is within an area of the metallization layers, forming an inorganic dielectric material over the composite device, hybrid bonding the second die to the composite device, and forming a plurality of lower interconnect interfaces on a side of the metallization layers opposite the first die.

In one or more nineteenth embodiments, further to the eighteenth embodiments, the method also includes coupling a structural substrate to the composite device.

In one or more twentieth embodiments, further to the eighteenth or nineteenth embodiments, hybrid bonding the second die to the composite device includes forming one or more first vias through the inorganic dielectric material, and hybrid bonding the second die to the first die and the first vias.

In one or more twenty-first embodiments, further to the eighteenth through twentieth embodiments, the plurality of metallization layers is a plurality of first metallization layers, and the method also includes receiving a plurality of second metallization layers, hybrid bonding the plurality of second metallization layers to the second die, forming the inorganic dielectric material over a portion of the first die and laterally adjacent the second die, and forming one or more second vias through the inorganic dielectric material, and coupling the plurality of second metallization layers to the second vias.

In one or more twenty-second embodiments, further to the eighteenth through twenty-first embodiments, the method also includes attaching a structural substrate over the plurality of second metallization layers, forming upper vias through the structural substrate, and forming a plurality of upper interconnect interfaces on a side of the structural substrate opposite the plurality of second metallization layers, wherein the upper vias couple the upper interconnect interfaces to the plurality of second metallization layers.

The disclosure can be practiced with modification and alteration, and the scope of the appended claims is not limited to the embodiments so described. For example, the above embodiments may include specific combinations of features. However, the above embodiments are not limiting in this regard and, in various implementations, the above embodiments may include the undertaking only a subset of such features, undertaking a different order of such features, undertaking a different combination of such features, and/or undertaking additional features than those features explicitly listed. The scope of the patent rights should, therefore, be determined with reference to the appended claims, along with the full scope of equivalents to which such claims are entitled.

We claim:

1. A multichip composite device, comprising:
- a plurality of first intradevice metallization layers spanning an area of the device;
- a first die coupled to an uppermost one of the first intradevice metallization layers, wherein the first die is fully within the area of the device;
- an inorganic dielectric material laterally adjacent the first die and over a portion of the first intradevice metallization layers;
- a second die hybrid bonded to the first die, wherein the second die is over a portion of the first die and over a portion of the inorganic dielectric material;
- one or more first vias extending through the inorganic dielectric material within the area of the device, and coupling the second die to one of the first intradevice metallization layers; and
- a plurality of second intradevice metallization layers over the second die, wherein the second die is hybrid bonded to a lowermost one of the second intradevice metallization layers and wherein the second die is fully within an area of the second intradevice metallization layers.

2. The multichip composite device of claim 1, wherein individual ones of the first intradevice metallization layers have a thickness of at least 1 μm.

3. The multichip composite device of claim 2, wherein the first die comprises a plurality of intradie metallization layers, and a thickest one of the intradie metallization layers has a thickness less than that of a thinnest one of the first intradevice metallization layers.

4. The multichip composite device of claim 1, further comprising a structural substrate over the second die, wherein the inorganic dielectric material is between the structural substrate and the first die and wherein the second intradevice metallization layers are between the second die and the structural substrate.

5. The multichip composite device of claim 4, wherein the structural substrate comprises crystalline silicon.

6. The multichip composite device of claim 1, wherein:
- one of the plurality of second intradevice metallization layers is coupled to the first die by one or more second vias extending through the inorganic dielectric material within the area of the device.

7. The multichip composite device of claim 6, further comprising a plurality of upper interconnect interfaces over the plurality of second intradevice metallization layers.

8. The multichip composite device of claim 1, wherein one of the plurality of first intradevice metallization layers comprises a plurality of lower interconnect interfaces on a side opposite the first die.

9. A multichip system, comprising:
- a plurality of first intradevice metallization layers coupled to a substrate, wherein one of the plurality of first intradevice metallization layers is coupled to a power supply through the substrate;
- an inorganic dielectric material over the first intradevice metallization layers;
- a first die adjacent the inorganic dielectric material and coupled to one of the plurality of first intradevice metallization layers, wherein the first die is within an area of the first intradevice metallization layers;
- a second die hybrid bonded to the first die and coupled to one of the first intradevice metallization layers by one or more first vias extending through the inorganic dielectric material within the area of the first intradevice metallization layers; and
- a plurality of second intradevice metallization layers hybrid bonded to, and over, the second die, wherein one of the second intradevice metallization layers is further coupled to at least one of:
  - a plurality of interconnect interfaces on a side of the second intradevice metallization layers opposite the second die; or
  - the first die by one or more second vias extending through the inorganic dielectric material within an area of the second intradevice metallization layers.

10. The multichip system of claim 9, wherein individual ones of the first intradevice metallization layers have a thickness of at least 1 μm.

11. The multichip system of claim 10, wherein the first die comprises a plurality of intradie metallization layers, and a thickest one of the intradie metallization layers has a thickness less than a thinnest one of the first intradevice metallization layers.

12. The multichip system of claim 9, further comprising a structural substrate over the second die, wherein the structural substrate spans the area of the second intradevice metallization layers, and the inorganic dielectric material is between the structural substrate and the first die.

13. The multichip system of claim 9, wherein:
- the second die is fully within an area of the second intradevice metallization layers.

14. The multichip system of claim 9, further comprising the plurality of interconnect interfaces and a structural substrate over the plurality of second intradevice metallization layers, wherein the structural substrate spans the area of the second intradevice metallization layers, and one of the second intradevice metallization layers is coupled to the interconnect interfaces by one or more upper vias extending through the structural substrate.

* * * * *